United States Patent
Oshima et al.

(10) Patent No.: US 6,812,127 B2
(45) Date of Patent: Nov. 2, 2004

(54) METHOD OF FORMING SEMICONDUCTOR DEVICE INCLUDING SILICON OXIDE WITH FLUORINE, EMBEDDED WIRING LAYER, VIA HOLES, AND WIRING GROOVES

(75) Inventors: Takayuki Oshima, Ome (JP); Hiroshi Miyazaki, Sayama (JP); Hideo Aoki, Musashimurayama (JP); Kazutoshi Ohmori, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/987,914

(22) Filed: Nov. 16, 2001

(65) Prior Publication Data

US 2002/0100984 A1 Aug. 1, 2002

(30) Foreign Application Priority Data

Nov. 29, 2000 (JP) ........................................ 2000-362462

(51) Int. Cl.[7] ...................... H01L 21/4763; H01L 21/44
(52) U.S. Cl. ........................ 438/622; 438/624; 438/637; 438/672
(58) Field of Search ............................... 438/622, 624, 438/637, 672; 257/738

(56) References Cited

U.S. PATENT DOCUMENTS

| | | | |
|---|---|---|---|
| 6,048,789 A | 4/2000 | Vines et al. | 438/633 |
| 6,136,680 A | 10/2000 | Lai et al. | 438/597 |
| 6,171,957 B1 | 1/2001 | Maekawa | 438/672 |
| 6,177,364 B1 * | 1/2001 | Huang | 438/792 |
| 6,181,012 B1 | 1/2001 | Edelstein et al. | 257/762 |
| 6,191,007 B1 | 2/2001 | Matsui et al. | 438/459 |
| 6,211,063 B1 * | 4/2001 | Liu et al. | 438/624 |
| 6,242,349 B1 | 6/2001 | Nogami et al. | 438/687 |
| 6,284,644 B1 * | 9/2001 | Aug et al. | 438/623 |
| 6,348,402 B1 | 2/2002 | Kawanoue et al. | 438/618 |
| 6,355,571 B1 | 3/2002 | Huang et al. | 438/706 |
| 6,521,532 B1 | 2/2003 | Cunningham | 438/687 |
| 6,627,554 B1 * | 9/2003 | Komada | 438/710 |

FOREIGN PATENT DOCUMENTS

| | | | | |
|---|---|---|---|---|
| JP | 8-316209 | 5/1995 | | H01L/21/3065 |
| JP | 9-306988 | 4/1996 | | H01L/21/768 |
| JP | 11111845 | * | 4/1999 | H01L/21/768 |

OTHER PUBLICATIONS

Stanley Wolf Ph.D. in Silicon Processing for the VLSI Era, vol. 2: Process Integration, Lattic Press, 1990, pp. 192–4.*
"The Etching of Low–1 Films—The keys to the application of organic films in Cu damascene structures are resistance to heating and to $O_2$–plasma", Semiconductor World 1998, pp. 74–76 (translation pp. 1–7).

* cited by examiner

Primary Examiner—William M. Brewster
(74) Attorney, Agent, or Firm—Reed Smith LLP; Stanley P. Fisher, Esq.; Juan Carlos A. Marquez, Esq.

(57) ABSTRACT

An interlayer dielectric film that surrounds via holes for connecting wirings of a second wiring layer and the wirings of third wiring layer is constituted of a dielectric material having a relatively smaller Young's modulus compared with the Young's modulus of a dielectric material constituting a dielectric film that surrounds wiring grooves in dual damascene wirings, which can improve the heat resistance and electromigration resistance of the dual damascene wirings.

5 Claims, 17 Drawing Sheets

23: INTERLAYER DIELECTRIC FILM
25: DIELECTRIC FILM
26: VIA HOLE
27: WIRING GROOVE

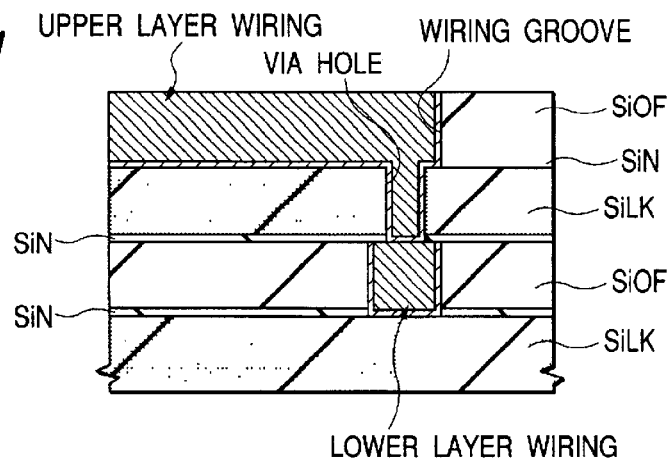
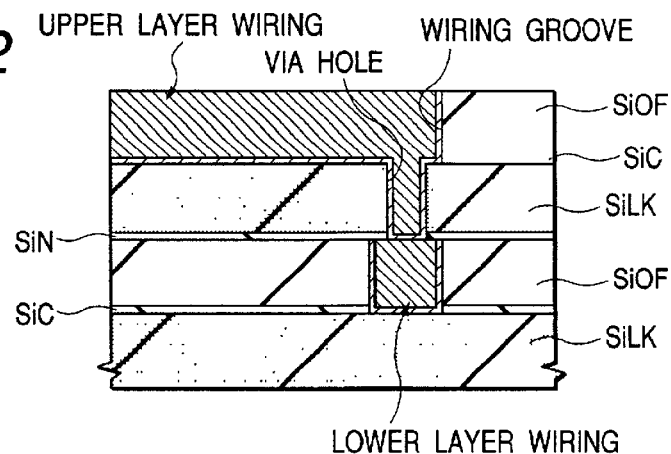
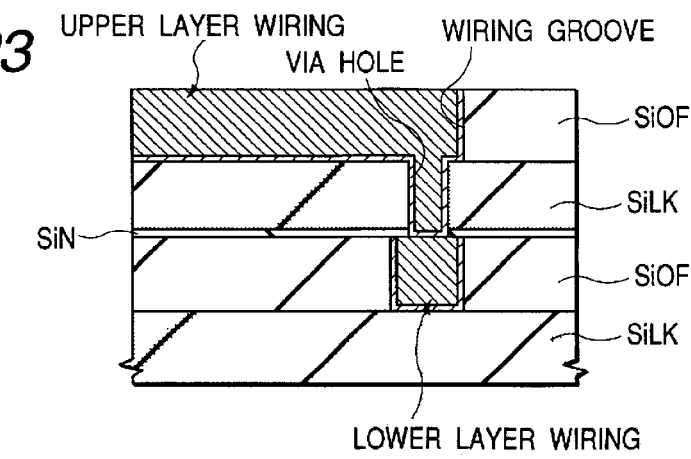

METHOD OF FORMING SEMICONDUCTOR DEVICE INCLUDING SILICON OXIDE WITH FLUORINE, EMBEDDED WIRING LAYER, VIA HOLES, AND WIRING GROOVES

BACKGROUND OF THE INVENTION

This invention concerns a semiconductor device and its manufacturing method and, more in particular, this invention relates to a multi-layered wiring structure formed by using a so-called dual damascene method and a technique effective to application to a semiconductor device having such a multi-layered wiring structure.

The multi-layered wiring technique is essential in the manufacture of semiconductor devices along with improvement in the performance and micro-miniaturization of the size in the semiconductor devices. As a method of forming wiring layers in semiconductor integrated circuits, it has been known a method of depositing a thin film of an aluminum (Al) alloy or a high melting metal such as tungsten (W) on a dielectric film, then forming a resist pattern of an identical shape with that of a wiring pattern on a thin film for wiring by a lithographic step and forming a wirings pattern using the resist pattern as a mask by a dry etching step. However, the method of using the aluminum alloy or the like involves a problem that wiring resistance increases remarkably along with size-reduction of the wirings to increase wiring delay and deteriorate the performance of the semiconductor device. Particularly, in high performance logic LSI (large scale integrated circuits), this performance inhibiting factor gives a significant problem.

In view of the above, it has been studied a so-called a damascene method of burying a wiring metal comprising copper (Cu) as the main conductor layer on a groove formed to a dielectric film and then removing excess metal outside of the groove by using a CMP (Chemical Mechanical Polishing) method thereby forming a wiring pattern in the groove. Particularly, a dual damascene method of forming wiring grooves in which the upper layer wirings are formed and via holes for connecting the upper layer wirings and the lower layer wirings respectively in the dielectric film and then burying a wiring metal into the via hole and the wiring groove simultaneously can reduce the wiring resistance by about 20% and remarkably simplify the manufacturing steps, decrease the cost and attain QTAT (Quick Turn and Around Time), compared with a method of using the aluminum alloy or the like described above.

By the way, for the dielectric film in which the wiring grooves are formed (hereinafter simply referred to as an inter-wiring layer film) and dielectric film in which the via holes are formed (hereinafter simply referred to as an inter via layer film), a laminate structure in which an etching stopper film and a silicon oxide film ($SiO_2$) are deposited successively from the lower layer is proposed. The silicon oxide film comprises a TEOS oxide film deposited, for example, by a plasma CVD (Chemical Vapor Deposition) method using a TEOS (Tetra Ethyl Ortho Silicate: $Si(OC_2H_5)$) gas and an ozone ($O_3$) gas. When the dielectric film is constituted of the TEOS oxide film, a silicon nitride (SiN) film usually deposited by a plasma CVD method is used as an etching stopper film.

However, since the specific dielectric constant of the silicon oxide film is about 4 and the specific dielectric constant of the silicon nitride film is about 7, it may be considered that abrupt increase of wiring delay caused by the increase of the wiring capacitance can not be suppressed only by the introduction of the copper wiring in and after the generation where 0.13 $\mu$m is a design rule. In view of the above, use of a low dielectric constant material with a specific dielectric constant of about 2 to 3 has been studied for the material constituting the inter-wiring layer film.

By constituting the inter-wiring layer film with a low dielectric constant film, the wiring capacitance can be reduced compared with the constitution with the silicon oxide film. Further, even when relatively thick wirings required for obtaining desired wiring resistance are formed, since the inter-wiring layer film is constituted of the low dielectric constant film, the wiring capacitance between the adjacent wirings in an identical layer can be suppressed relatively lower.

As a method of forming damascene wirings by applying the interlayer dielectric film comprising the low dielectric constant material, several methods have been proposed and an etching process in a case of adopting various dielectric constant materials for the duel damascene wirings is described, for example, in "monthly Semiconductor World", p 74 –p 76, issued from Press Journal, 1998, November.

Further, Japanese Published Unexamined Patent Application Hei 8(1996)-316209 by Tatsumi discloses a method of forming a via hole to a stacked dielectric film of low dielectric constant where a silicon oxide type dielectric film is formed on an organic polymeric dielectric film by patterning a silicon oxide type dielectric film and then plasma etching the organic polymeric dielectric film of the lower layer by an O-type gas using the silicon oxide type dielectric pattern as a mask.

Further, Japanese Published Unexamined Patent Application Hei 9(1997)-306988 by Suzuki et al discloses a method of forming, on a first dielectric film covering lower layer wirings, a second dielectric film of a lower etching rate than that of the first dielectric film, then forming openings to the second dielectric film and then forming a third dielectric film of a higher etching rate than that of the second dielectric film. Subsequently, grooves for exposing the openings are formed to the third dielectric film and forming via holes in the first dielectric film under the openings.

SUMMARY OF THE INVENTION

However, when the present inventors have studied on copper dual damascene in which the inter-wiring layer film is constituted of the low dielectric constant film and the inter-via layer film is constituted of a silicon oxide film, it has been found that the following problems are present.

For example, when copper as the connection members in the via hole is thermally expanded by the temperature elevation from room temperature to about 500° C., stress is formed in the direction of widening the via hole. However, the silicon oxide film constituting the inter-via layer has a characteristic showing relatively large thermal stress of about 130 MPa and Young's modulus of about 70 GPa respectively and causing less elastic deformation. Therefore, the silicon oxide film repulses strongly to the stress of copper and, as a result, the silicon oxide film forms a stress in the direction of compressing the copper in the via hole.

Since the stress caused by the expansion of the copper repulses the stress from the silicon oxide film as the inter-via layer film to each other, a portion of the expanded copper in the via hole is absorbed to copper as the wiring member in the wiring groove. When volume shrinkage occurs by temperature lowering, the amount of copper becomes insufficient to fill the inside of the via hole to cause voids in the via hole. This increases the resistance of the connection member in the via hole given with the thermal stress and, further, the life of wirings is deteriorated by electromigration.

This invention intends to provide a technique capable of improving the heat resistance and the electromigration resistance of dual damascene wirings.

The foregoing and other objects and novel features of this invention will become apparent with reference to the description of the specification and the accompanying drawings.

Among the inventions disclosed in this application, outlines for typical one are simply explained as below.

(1) A semiconductor device according to this invention comprises wirings formed in wiring grooves and a connection member formed integrally with the wirings in via holes for connecting the wirings and lower layer wirings thereof in which the Young's modulus of a first dielectric layer formed with the via holes is relatively smaller than the Young's modulus of a second dielectric layer formed with wiring grooves.

(2) A method of fabricating a semiconductor device comprising wirings formed in wiring grooves and a connection member formed integrally with the wirings in via holes for connecting the wirings and lower layer wirings thereof in which the Young's modulus of a first dielectric layer formed with the via holes is relatively smaller than the Young's modulus of a second dielectric layer formed with wiring grooves, comprises a step of forming a first dielectric layer with a relatively small Young's module and a second dielectric layer with a relatively large Young's modulus successively on a substrate, a step of forming via holes at predetermined regions of the first dielectric layer and forming wiring grooves at predetermined regions of a second dielectric layer and burying a conductive member inside the via holes and the wiring grooves.

According to the constitution described above, since the wiring grooves buried with the wirings are surrounded with the second dielectric layer of a relatively large Young's modulus, and the via holes for connecting the wirings and the lower layer wirings thereof are surrounded with the first dielectric layer of a relatively small Young's modulus, even when the volume of the connection member formed integrally with the wirings in the via holes is expanded by temperature elevation, the first dielectric layer causes elastic deformation correspondingly and the second dielectric layer functions to suppress the volumic expansion of the wirings, absorption of the connection member in the via holes to the wiring member in the wiring grooves can be suppressed.

BRIEF DESCRIPTION OF THE DRAWINGS

FIG. 21 is a cross sectional view for a main portion of a semiconductor substrate which shows an example of a method of manufacturing dual damascene wirings in the order of steps as Embodiment 2 of this invention;

FIG. 22 is a cross sectional view for main portion of a semiconductor substrate showing a first modified example of dual damascene wirings as Embodiment 2 of this invention;

FIG. 23 is a cross sectional view for main portion of a semiconductor substrate showing a second modified example of dual damascene wirings as Embodiment 2 of this invention;

DETAILED DESCRIPTION OF PREFERRED EMBODIMENTS

Figure 1:
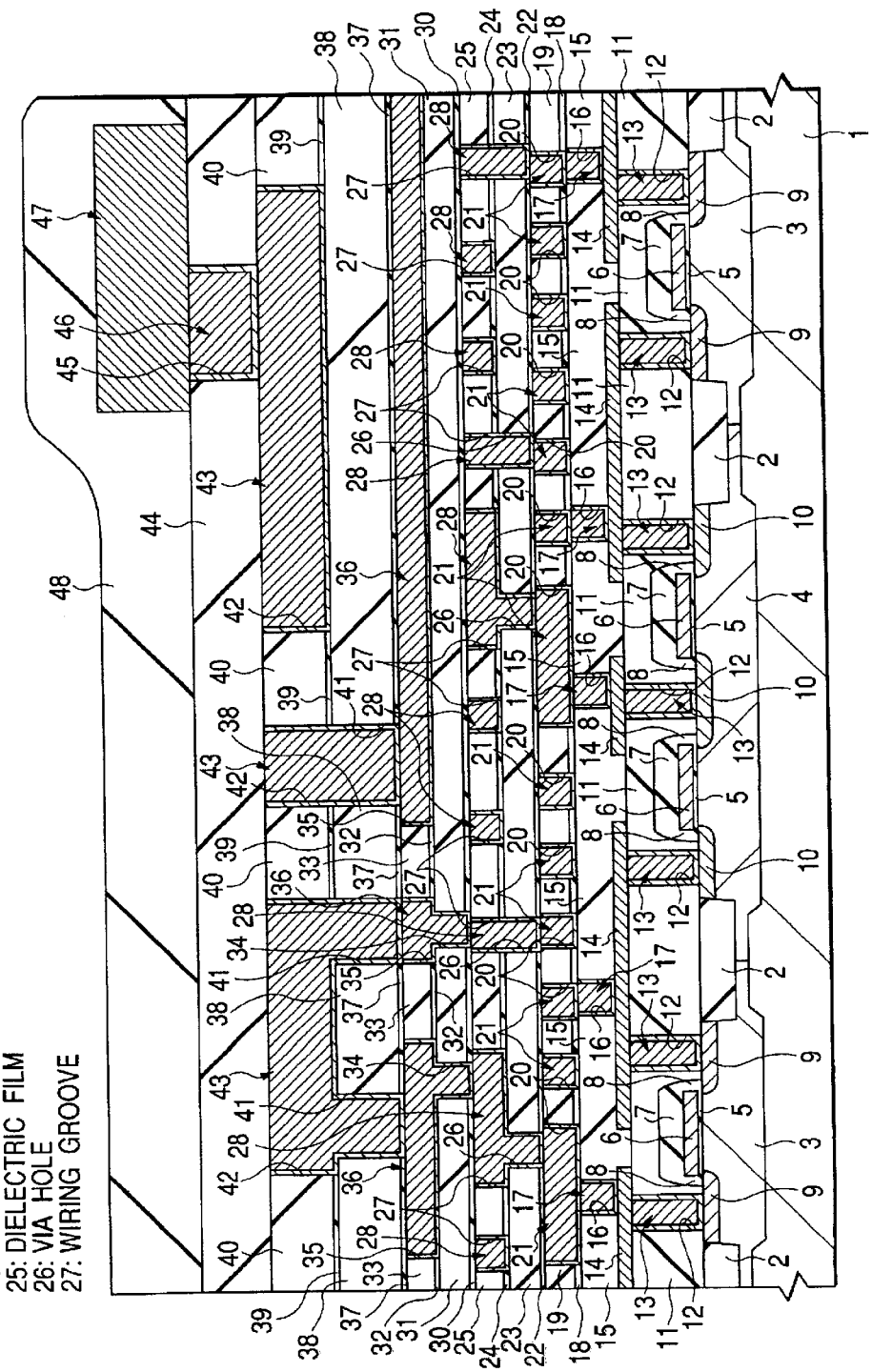
FIG. 1 is a cross sectional view for a main portion of a semiconductor substrate showing a semiconductor device as Embodiment 1 of this invention.

Preferred embodiments of this invention are to be explained more specifically with reference to the drawings. Throughout the drawings for explaining the preferred embodiments, those members having identical functions carrying the same reference numerals for which duplicated explanation are to be omitted.

In the present application, "semiconductor device" means not only those prepared particularly on single crystal silicon substrates but also include those prepared on other substrates such as SOI (Silicon On Insulator) substrate or substrate for the manufacture of TFT (Thin Film Transistor) liquid crystals excepting for the case otherwise specified.

Further, in the preferred embodiments to follow, when the number of elements and the (including number, values, amount and range) is referred to, the invention are not restricted on such particular number but may be more than or less than the particular number unless specified distinctly or apparently restricted to the specified number in principle. Further, in the following embodiments, the constituent factors (including element step or the like) are not always essential unless specified distinctly or considered apparently essential in view of principle.

In the same manner, when the shape and the positional relation for constituent elements are referred to in the following preferred embodiments, they substantially include also those approximate to or similar with such shape and the like unless specified distinctly or where it is not considered apparently in principle. This may be applied in the same manner to the numerical values and the ranges described above.

Embodiment 1

FIG. 1 is a cross sectional view for a main portion of a semiconductor substrate showing a semiconductor device as Embodiment.

A p-well 3 or an n-well 4 is formed being surrounded with a device isolation regions 2 as a selective region on the main surface of a semiconductor substrate 1. A gate insulation film 5 is formed on the surface of an active region (p-well 3 and n-well 4) surrounded with the device isolation region 2, and a gate electrode 6 comprising polycrystal silicon is formed on the gate insulation film 5. The gate electrode 6 is formed by depositing a polycrystal silicon film and a cap insulation film successively on the semiconductor substrate 1 and then etching them successively. Further, side wall spacer 8 is disposed on the side wall of the gate electrode 6.

In the p-well 3, an n-semiconductor region 9 formed in self alignment to the gate electrode 6 and the side wall spacer 8 is disposed. The n-semiconductor region 9 constitutes source and drain of an n-channel MISFET (Metal Insulator Semiconductor Field Effect Transistor). In the same manner, in the n-well 4, an p-semiconductor region 10 formed in self alignment to the gate electrode 6 and the side wall spacer 8 is disposed. The p-semiconductor region 10 constitutes source and drain of an p-channel MISFET.

The semiconductor device of Embodiment 1 is an embodiment of forming a CMOS (Complimentary Metal Oxide Semiconductor) device as a constituent element of ASIC (Application Specific Integrated Circuit) to the semiconductor substrate but embodiments of forming various semiconductor elements such as bipolar transistors, resisters and capacitors to the semiconductor substrate 1 can also be adopted.

Further, the source and drain of the n-channel M-SFET and source and drain of the p-channel MISFET may be constituted as an LDD (Lightly Doped Drain) structure comprising a semiconductor region at a relatively low concentration and a semiconductor region at a relatively high concentration.

Further, the n-channel MISFET and the p-MISFET are covered with first interlayer dielectric film 11. Via holes 12 are formed to predetermined portions of the first interlayer dielectric film 11 above the n-semiconductor region 9 or the p-semiconductor region 10 and plugs 13, for example, made of a tungsten film are buried in the via holes 13. Wirings 14 for the first wiring layer comprising, for example, a tungsten film is formed being connected with the plugs 13 on the first interlayer dielectric film 11.

A second interlayer dielectric film 15 is formed on the wirings 14 of the first wiring layer. The second interlayer dielectric film 15 is constituted, for example, with a silicon oxide film, and via holes 16 are formed at predetermined regions in the second interlayer dielectric film 15. In the via holes 16, plugs 17 comprising, for example, a barrier metal layer and a copper film as a main conductive layer are buried. The barrier metal layer has a function of preventing diffusion of copper as the main ingredient of the wirings and the connection members and improving adhesion between the copper and the dielectric film. The barrier metal layer is made, for example, of titanium nitride (TiN), tantalum (Ta) and tantalum nitride (TaN).

A stopper dielectric film 18 and, further, a dielectric film 19 for forming wirings are formed above the plugs 17. The stopper dielectric film 18 is a film forming an etching stopper upon fabrication of grooves in the dielectric film 19, and a material having an etching selective ratio relative to the dielectric film 19 is used. The stopper dielectric film 18 is made, for example, of a silicon nitride film and the dielectric film 19 is made, for example, of a silicon oxide film. Wiring grooves 20 reaching the plugs 17 are formed in the stopper dielectric film 18 and the dielectric film 19. Wirings 21 for the second wiring layer comprising a barrier metal layer and a copper film as a main conductive layer are buried in the wiring grooves 20. The barrier metal layer is made, for example, of titanium nitride, tantalum and tantalum nitride.

A cap insulation film 22, an interlayer dielectric film 23, stopper dielectric film 24 for forming wirings and a dielectric film 25 for forming wirings are successively formed above the wirings 21 of the second wiring layer. Via holes 26 reaching the wirings 21 of the second wiring layer are formed in the cap insulation film 22 and the interlayer dielectric film 23, and wiring grooves 27 in which a third wiring layer is buried are formed in the stopper dielectric film 24 and the dielectric film 25. The hole diameter of the via hole 26 is, for example, about 0.25 µm.

The cap insulation film 22 is constituted of a material having an etching selectivity ratio relative to the interlayer insulation film 23 and may be made, for example, of a silicon nitride film. Since the specific dielectric constant of the silicon nitride film is relatively high as about 7, it is desirable that the film thickness of the cap insulation film 22 comprising the silicon nitride film is as thin as possible providing that the film thickness is enough to provide the stopper function, while considering the reduction of the wiring capacitance. In view of the requirement described above, the thickness of the cap insulation film 22 can be made, for example, at about 50 nm The interlayer dielectric film 23 is constituted of a material having a Young's modulus of relatively smaller than the Young's modulus of the material constituting the dielectric film 25 and the film 23 can be a silicon oxide (SiOF) film with addition of fluorine (F) having a Young's modulus of about 50 GPa for instance. The thickness of the interlayer dielectric film 23 can be, for example, of about 500 nm.

The stopper dielectric film 24 is constituted of a material having an etching selectivity ratio relative to the dielectric film 25, the interlayer dielectric film 23 or to both of them, and can be made, for example, of a silicon nitride film. Since the specific dielectric constant of the silicon nitride film is relatively high as about 7 in the same manner as the cap insulation film, it is desirable that the thickness of the stopper dielectric film 24 comprising the silicon nitride film is as thin as possible providing that the thickness is enough to attain the stopper function while considering the reduction of the wiring capacitance. In view of the requirement described above, the thickness of the stopper dielectric film 24 can be made, for example, at about 25 nm.

The dielectric film 25 can be made, for example, of a silicon oxide film having an Young's modulus of about 70 GPa. Since the wiring grooves 27 to be buried with the third wiring layer are formed in the stopper dielectric film 24 and the dielectric film 25, the total thickness thereof is determined depending on the designed thickness required for a third wiring layer and the thickness of the dielectric film 25 can be, for example, of about 200 nm.

Wirings 28 for the third wiring layer are formed in the via holes 26 and the wiring grooves 27 and the connection member buried in the via holes for connecting the wirings 28 and the wirings 21 of the second wiring layer are formed integrally with the wirings 28. That is, the wirings 28 for the third wiring layer are formed by using the dual damascene method. The wiring member and the connection member comprise, for example, a barrier metal layer 29 and a copper film as the main conductor layer and the barrier metal layer is made, for example, of titanium nitride, tantalum and tantalum nitride.

In this case, the interlayer dielectric film 23 that surrounds the via holes 26 for connecting the wirings 21 of the second wiring layer and the wirings 28 of the third wiring layer comprises an SiOF film having a Young's modulus of about 50 GPa, and the dielectric film 25 that surrounds the wiring grooves 27 buried with the wirings 28 of the third wiring layer comprises a silicon oxide film having a Young's modulus of about 70 GPa, and the interlayer dielectric film 23 is constituted of a dielectric material having a Young's modulus smaller by about 20 GPa compared with the Young's modulus of the dielectric film 25. Thus, even when the volume of the copper is expanded by temperature elevation, for example, from room temperature to about 500° C., since the interlayer dielectric film 23 elastically deforms correspondingly, while the dielectric film 25 functions to suppress the volumic expansion of the copper, absorption of copper inside the via holes 26 to the copper inside the wiring grooves 27.

Further, since the specific dielectric constant of the SiOF film constituting the interlayer dielectric film 23 is about 3.6 which is smaller compared with the specific dielectric constant (about 4.3) of the silicon oxide film, the wiring capacitance can be reduced more than in the structure using the silicon oxide film both for the interlayer dielectric film 23 and the dielectric film 25.

A cap insulation film 30, an interlayer dielectric film 31, a stopper dielectric film 32 for forming wirings and a dielectric film 33 for forming wirings are formed successively above the wirings 28 of the third wiring layer. Each of the dielectric film 30 to 33 is identical with each of the stopper dielectric film 22, the interlayer dielectric film 22, the interlayer dielectric film 23, the stopper dielectric film 24 for forming the wirings and the dielectric film 25 for forming the wirings. The interlayer dielectric film 31 is constituted, for example, with an SiOF film with a thickness of about 500 nm and the dielectric film 33 is constituted, for example, with a silicon oxide film with a thickness of about 200 nm. Further, via holes 34 are formed in the cap insulation film 30 and the interlayer dielectric film 31, and wiring grooves 35 are formed in the stopper dielectric film 32 and the dielectric film 33. The hole diameter of the via hole 34 is, for example, about 0.25 µm. Further, wirings 36 of a fourth wiring layer formed integrally with the connection member are formed. The wiring layer 36 of the fourth wiring layer comprise, for example, a barrier metal layer and a copper film as the main conductive layer in the same manner as the wirings 28 of the third wiring layer.

For example, even when the volume of copper is expanded by temperature elevation, for example, from the room temperature to about 500° C., since the interlayer dielectric film 31 elastically deforms correspondingly, while the dielectric film 33 functions to suppress the volumic expansion of copper, absorption of the copper inside the via holes 34 to the copper inside the wiring grooves 35 can be suppressed. Further, the wiring capacitance can be reduced more than that in the structure of using the silicon oxide film both for the interlayer dielectric film 31 and the dielectric film 33.

A cap insulation film 37, an interlayer dielectric film 38, a stopper dielectric film 39 for forming wirings and a dielectric film 40 for forming wirings are formed successively above the wirings 36 of the fourth wiring layer. Each of the dielectric films 37 to 40 is identical each of the stopper dielectric film 22, the interlayer dielectric film 22, the interlayer dielectric film 23, the stopper dielectric film 24 for forming the wirings and the dielectric film 25 for forming the wirings. The interlayer dielectric film 38 is constituted, for example, with an SiOF film with a thickness of about 500 nm and the dielectric film 33 is constituted, for example, with a silicon oxide film with a thickness of about 200 nm. Further, via holes 41 are formed in the cap insulation film 37 and the interlayer dielectric film 33 and wiring grooves 42 are formed in the stopper dielectric film 39 and the dielectric film 40. The hole diameter of the via hole 41 is, for example, about 0.5 µm. Further, wirings 43 of a fifth wiring layer formed integrally with the connection member are formed. The wiring layers 43 of the fifth wiring layer comprise, for example, a barrier metal layer and a copper film as the main conductive layer in the same manner as the wirings 28 of the third wiring layer.

For example, even when the volume of copper is expanded by temperature elevation, for example, from the room temperature to about 500° C., since the interlayer dielectric film 38 elastically deforms correspondingly, while the dielectric film 40 functions to suppress the volumic expansion of copper, absorption of the copper inside the via holes 41 to the copper inside the wiring grooves 42 can be suppressed. Further, the wiring capacitance can be reduced more than that in the structure of using the silicon oxide film both for the interlayer dielectric film 38 and the dielectric film 40.

A dielectric film 44 is formed on the wirings 43 of the fifth wiring layer and via holes 45 are apertured at a necessary portion in the dielectric film 44. The hole diameter of the via hole 45 is, for example, about 0.75 $\mu$m. Plugs 46 comprising, for example, a tungsten film are buried in the via holes 45, and wirings 47 of a sixth wiring layer on the dielectric film 44 are connected by way of the plugs 46 with the wirings 43 of the fifth wiring layer. Further, the entire surface of the semiconductor substrate 1 is covered with a passivation film 48.

TABLE 1

| Generation | Comparative Example | First Generation | | |
|---|---|---|---|---|
| Inter wiring layer film (Young's modulus: Y2) | SiO$_2$ (70 GPa) | SiO$_2$ (70 GPa) | | |
| Inter-via layer film (Young's modulus: Y1) | SiO$_2$ (70 GPa) | SiOF (50 GPa) | | |
| Stopper dielectric film | SiN | SiN | SiC | None |
| Via hole diameter: R | 0.25 $\mu$m | 0.25 $\mu$m | | |
| Index R/Y1 | 3.6 | 5.0 | | |
| Y2 − Y1 | 0 | 20 | | |
| Wiring capacitance | 4.7 | 4.5 | 4.2 | 4.0 |

Figure 2:
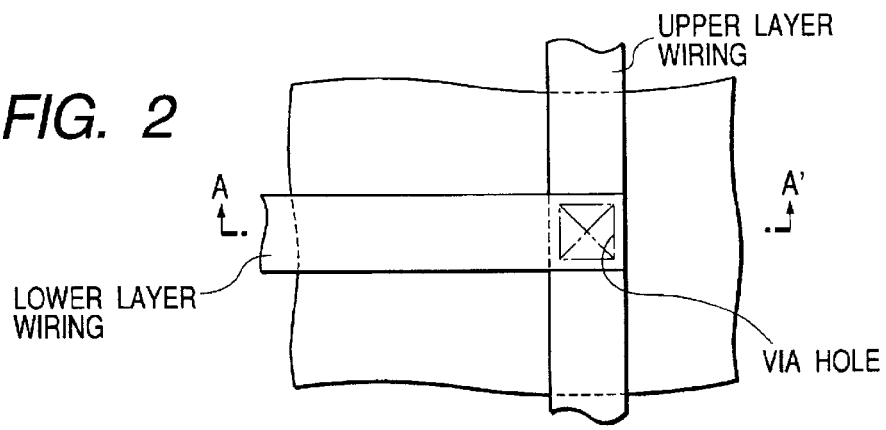
FIG. 2 is an example of a plan view for a main portion of dual damascene wirings as Embodiment 1 of this invention.

Table 1 collectively shows the materials for each of the dielectric films and the evaluation index of the dual damascene structure in Embodiment 1. Further, FIG. 2 shows an example of a plan view for a main portion of dual damascene wirings applied with Embodiment 1 and FIG. 3 to FIG. 7 show an example of a method of manufacturing dual damascene wirings with reference to a cross sectional view for a main portion of a semiconductor substrate along line A–A' in FIG. 2. Embodiment 1 shows each of dielectric materials applied to dual damascene wirings with the hole diameter of the via hole connecting the upper and lower wiring layers of about 0.5 $\mu$m or less as the first generation. The inter-wiring layer film is made of a dielectric material having a Young's modulus of 60 GPa or more and the inter-via layer film is made of a dielectric material having a Young's modulus of less than 60 GPa, both of which are constituted of the dielectric material formed by a CVD method. Table 1 and FIG. 3 to FIG. 7 shows an example of dual damascene wirings using a silicon oxide film having a Young's modulus of about 70 GPa for the inter-wiring layer film and an SiOF film having a Young's modulus of about 50 GPa as the inter-via layer film (third wiring layer to fifth wiring layer in the semiconductor device shown in FIG. 1).

For preparing the evaluation index, while dual damascene wirings having of the via holes with the hole diameter of 0.25 $\mu$m were used, it can of course be applied also to dual damascene wirings having via holes with the hole diameter of other than 0.25 $\mu$m.

The index: R/Y1 in Table 1 is a value obtained by divided the hole diameter R of the via hole with the Young's modulus Y1 of the inter-via layer film. The reciprocal Y1/R corresponds to a compressing pressure of the inter-via layer film that surrounds the via hole exerted on the via hole and as Y1/R is smaller, that is, R/Y1 is larger, degradation of wirings can be suppressed more. Index: Y2−Y1 is a difference between the Young's modulus Y2 of the inter-wiring layer film and the Young's modulus Y1 of the inter-via layer film. Y2−Y1 corresponds to the pressure difference to the wirings between the inter-wiring layer film and the inter-via layer film. As the value is larger, degradation of the wirings can be suppressed more. That is, it is considered that as both of the indexes: R/Y1 and Y2−Y1 are greater, degradation of the dual damascene wirings can be suppressed more. As a comparative example, a dual damascene structure in which the inter-wiring layer film comprises a silicon oxide film and the inter-via layer film comprises a silicon oxide film is shown in Table 1.

As shown in Table 1, when the inter-via layer film is constituted of the SiOF film, the index: R/Y1 increases from 3.6 of the comparative example to 5.0 and the index Y2−Y1 increases from 0 of the comparative example to 20. It is thus considered that degradation of the dual damascene wirings can be suppressed more in the dual damascene structure of the first generation than the comparative example. Further, the wiring capacitance can be decreased from 4.7 of the comparative example to 4.5.

Then, explanation is to be made to a method of manufacturing dual damascene wirings by using a cross sectional view for a main portion of a semiconductor substrate shown in FIG. 3 to FIG. 7.

Figure 3:
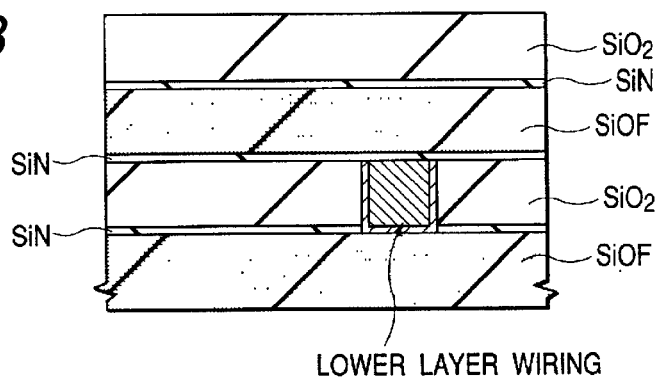
FIG. 3 is a cross sectional view for a main portion of a semiconductor substrate which shows an example of a method of manufacturing dual damascene wirings in the order of steps as Embodiment 1 of this invention.

At first, as shown in FIG. 3, a silicon nitride film constituting a cap insulation film, an SiOF film having a Young's modulus of about 50 GPa constituting an inter dielectric layer film, a silicon nitride film constituting a stopper dielectric film for forming wirings and a silicon oxide film having a Young's modulus of about 70 GPa constituting a dielectric film for forming wirings are successively formed above the lower layer wirings. Via holes are formed in the subsequent step to the cap insulation film and the interlayer dielectric film, and wiring grooves are formed in a subsequent step to the stopper dielectric film and the dielectric film.

The silicon nitride film constituting the cap insulation film is formed, for example, by a plasma CVD method and has a specific dielectric constant of about 7. The film thickness can be made, for example, to about 50 nm. It is desirable that the thickness of the silicon nitride film of a relatively high specific dielectric constant is as thin as possible providing that the thickness is enough to attain the stopper function, while considering reduction of the wiring capacitance.

The SiOF film constituting the interlayer dielectric film is formed, for example, by a CVD method and has a specific dielectric constant of about 3.6 and a Young's modulus of about 50 GPa. The film thickness can be made, for example, to about 500 nm.

The silicon nitride film constituting the stopper dielectric film is formed, for example, by a plasma CVD method and has a specific dielectric constant of about 7. The thickness can be made, for example, to about 25 nm. It is desirable that the thickness of the silicon nitride film of a relatively high specific dielectric constant is as thin as possible providing that the thickness is enough to attain the stopper function while considering reduction of the wiring capacitance.

The silicon oxide film constituting the dielectric film is formed, for example, by a CVD method and has a specific dielectric constant of about 4.3 and a Young's modulus of about 70 GPa. The thickness can be, for example, about 200 nm. Since wiring grooves to be buried with upper layer wirings are formed in the stopper dielectric film (silicon nitride film) and a dielectric film (silicon oxide film), the total film thickness is determined depending on the designed thickness required for the upper layer wirings.

Then, via holes are formed to the cap insulation film (silicon nitride film) and the interlayer dielectric film (SiOF film), and wiring grooves are formed to the stopper dielectric film (silicon nitride film) and the dielectric film (silicon oxide film). As a method of forming the via holes and the wiring grooves by the dual damascene method, the following method can be shown for example.

Figure 4:
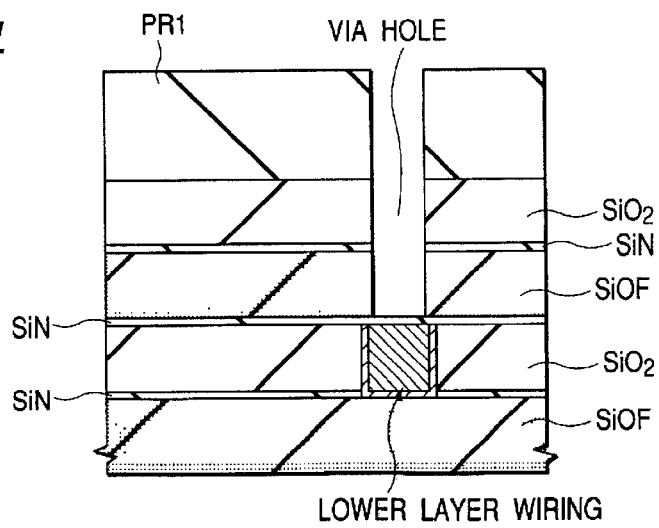
FIG. 4 is a cross sectional view for a main portion of a semiconductor substrate which shows an example of a method of manufacturing dual damascene wirings in the order of steps as Embodiment 1 of this invention.

At first, as shown in FIG. 4, via holes are formed to the interlayer dielectric film (SiOF film). The hole diameter of the via hole to be formed is, for example, about 0.25 $\mu$m. The via hole is formed by forming a photoresist film PR1 patterned to a hole pattern on a dielectric film (silicon oxide film), and successively etching a dielectric film (silicon oxide film), a stopper dielectric film (silicon nitride film) and an interlayer dielectric film (SiOF film) using the photoresist film PR1 as a mask. In this step, the cap insulation film (silicon nitride film) functions as an etching stopper layer. Since the dielectric materials are inorganic dielectric films deposited by the CVD method, a processing technique similar with the existent dry etching method can be applied.

Figure 5:
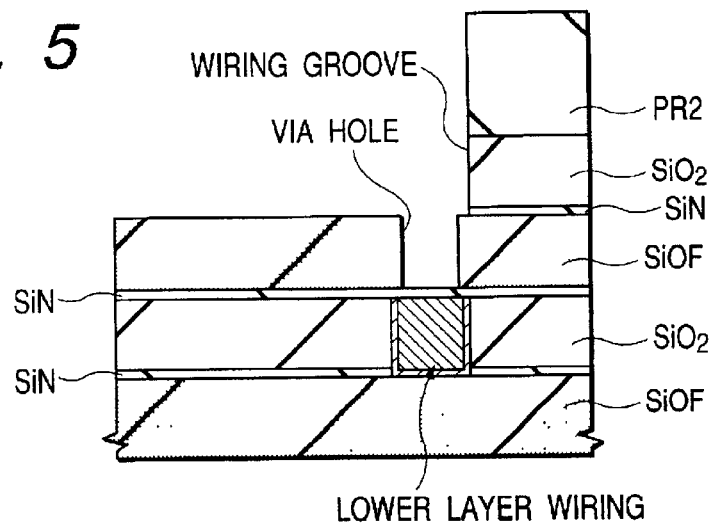
FIG. 5 is a cross sectional view for a main portion of a semiconductor substrate which shows an example of a method of manufacturing dual damascene wirings in the order of steps as Embodiment 1 of this invention.

Then after removing the photoresist film PR1, as shown in FIG. 5, a phtoresist film PR2 patterned into a groove pattern is formed on a dielectric film (silicon oxide film) and a dielectric film (silicon oxide film) is etched, for example, by a dry etching method using a photoresist film PR2 as a mask in the same manner as that for forming the via holes. In this step, the stopper dielectric film (silicon nitride film) functions as an etching stopper layer. Subsequently, the exposed stopper dielectric film (silicon nitride film) is removed by etching.

Then, upper layer wirings comprising a barrier metal layer and a copper film as a main conductive layer. The connection member for connecting the upper layer wirings and the lower layer wirings are formed integrally with the upper layer wirings. As the method of forming the upper layer wirings, the following method can be exemplified.

Figure 6:
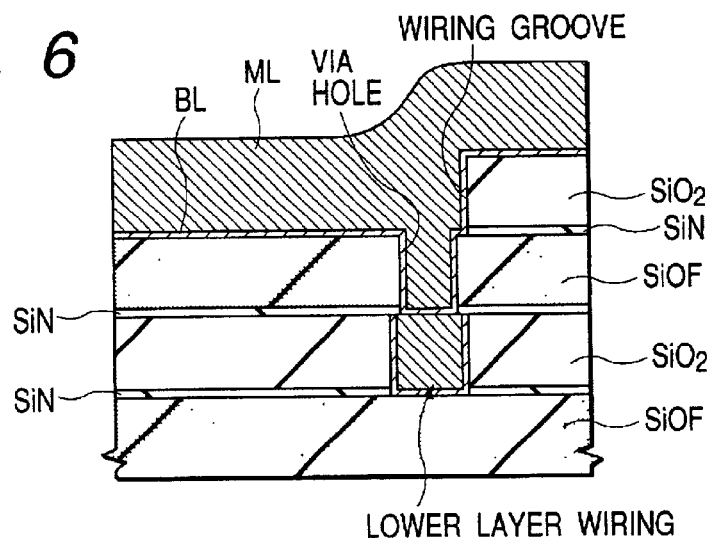
FIG. 6 is a cross sectional view for a main portion of a semiconductor substrate which shows an example of a method of manufacturing dual damascene wirings in the order of steps as Embodiment 1 of this invention.

At first, the photoresist film PR2 is removed. Then, as shown in FIG. 6, the cap insulation film (silicon nitride film) exposed at the bottom of the via hole is removed by etching and then a barrier metal layer BL is formed. The barrier metal layer BL is made, for example, of titanium nitride, tantalum or tantalum nitride. Then, a seed layer (not illustrated) is formed on the barrier metal layer BL. The seed layer functions as a seed for forming the copper plating layer and is constituted of copper. The seed layer is formed, for example, by a CVD method or a sputtering method.

Then, a copper plating layer ML is formed. For the plating, any of electrolytic plating or electroless plating may be used. The thickness of the plating layer ML is about 600 nm on a substrate plane. Thus, the via holes and the wiring grooves are buried simultaneously. The copper film may be formed also by a sputtering method instead of formation of the copper film (plating layer ML) by the plating method. In this case, the seed layer is not necessary. In a case where the copper film is formed by the sputtering method, a heat treatment is applied so as to bury copper in the via holes and the wiring grooves and copper can be put to reflow.

Figure 7:
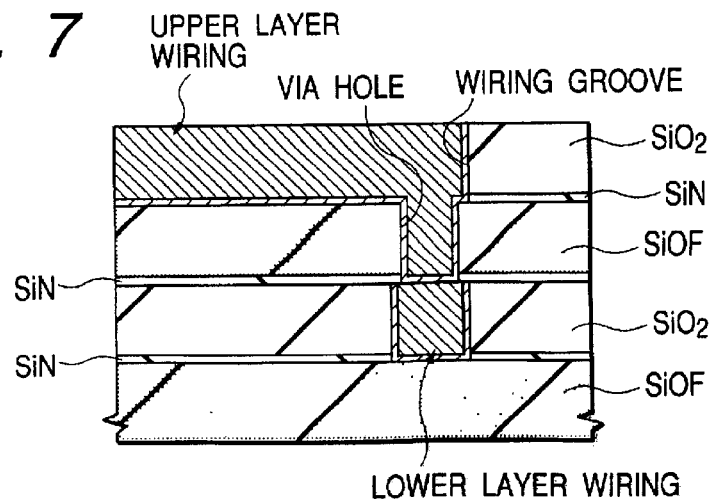
FIG. 7 is a cross sectional view for a main portion of a semiconductor substrate which shows an example of a method of manufacturing dual damascene wirings in the order of steps as Embodiment 1 of this invention.

Then, as shown in FIG. 7, the plating layer ML and the seed layer are polished by using a CMP method. Polishing is continued further and the barrier metal layer BL on the dielectric film (silicon oxide film) is also removed. Thus, the barrier metal layer BL in the regions other than those for the wiring grooves and the copper film (plating layer ML and seed layer) are removed and, upper layer wirings formed integrally with the connection member are formed.

Figure 8:
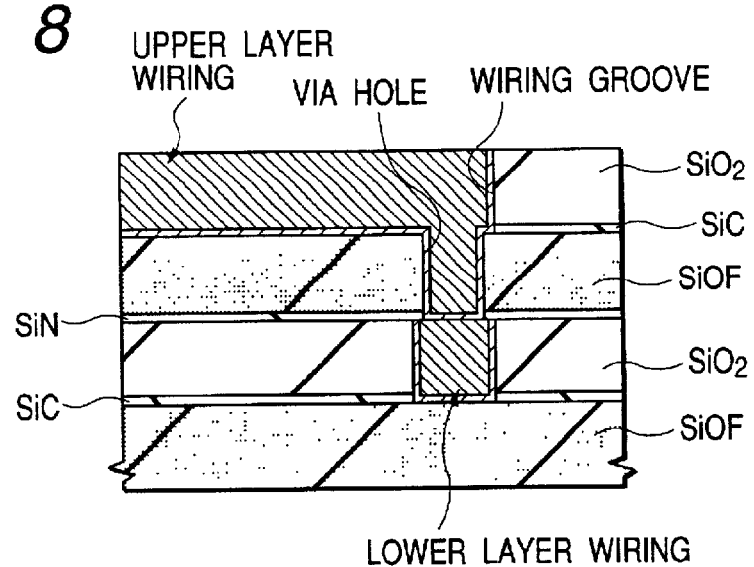
FIG. 8 is a cross sectional view for a main portion of a semiconductor substrate which shows a first modified example of a method of manufacturing dual damascene wirings in the order of steps as Embodiment 1 of this invention.

FIG. 8 shows a first modified example of dual damascene wirings in Embodiment 1. A stopper dielectric film is constituted of a material having an etching selectivity ratio to the inter-wiring layer film (silicon oxide film), inter-via layer film (SiOF film) or both of them, in the dual damascene wirings shown in FIG. 1 and FIG. 7 and a silicon nitride film s shown as an example. However, since the specific dielectric constant of the silicon nitride film is relatively high as about 7, it is desirable that the dielectric film has a relatively low specific dielectric constant and has a stopper function. FIG. 8 shows a dual damascene structure using a silicon oxide film for an inter-wiring layer film, an SiOF film for an inter-via layer film and an SiC film having a specific dielectric constant of about 4 as a stopper dielectric film. By constituting the stopper dielectric film with the SiC film, wiring capacitance can be reduced from 4.5 to 4.2 compared with a case of constituting the stopper dielectric film with a silicon nitride film.

Figure 9:
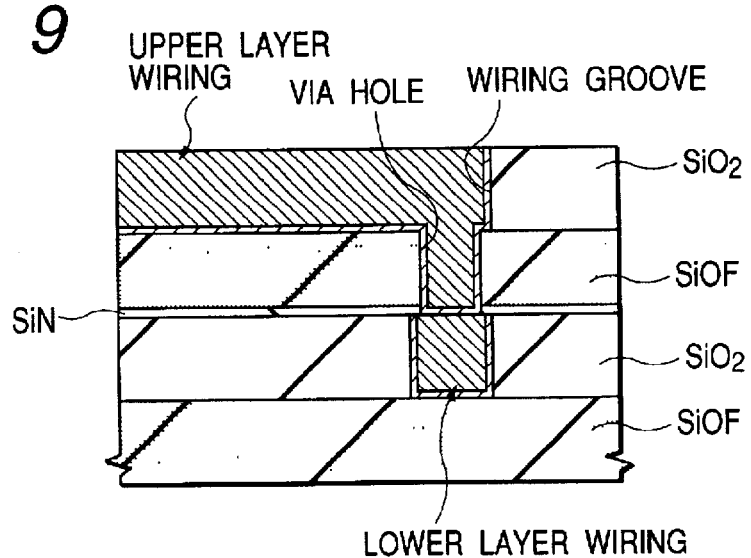
FIG. 9 is a cross sectional view for a main portion of a semiconductor substrate which shows a second modified example of a method of manufacturing dual damascene wirings in the order of steps as Embodiment 1 of this invention.

Further, FIG. 9 shows a second modified example of dual damascene wirings in Embodiment 1. Dual damascene wirings in which the wiring capacitance is reduced without using the stopper dielectric film is shown here. Since the stopper dielectric film is not used, the wiring capacitance can be reduced to 4.5 to 4.0 compared with the case of using the stopper dielectric film comprising the silicon nitride film.

Then, an example for a method of fabricating a semiconductor device of Embodiment 1 shown in FIG. 1 is to be explained in the order of steps with reference to cross sectional views for a main portion of the semiconductor substrate shown in FIG. 10 to FIG. 20.

Figure 10:
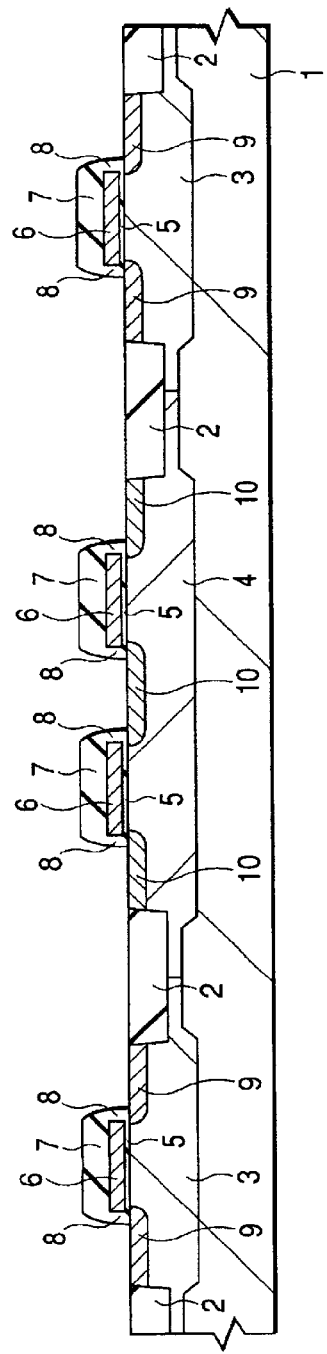
FIG. 10 is a cross sectional view for a main portion of a semiconductor substrate which shows an example of a method of fabricating a semiconductor device in the order of steps as Embodiment 1 of this invention.

At first, as shown in FIG. 10, a semiconductor substrate 1 comprising, for example, p⁻ single crystal silicon is provided and a device isolation region 2 is formed on the main surface of the semiconductor substrate 1. The device isolation region 2 can be formed, for example, as described below. At first, a silicon oxide film and a silicon nitride film are formed successively on the main surface of the semiconductor substrate 1, the silicon nitride film is etched by using a patterned photoresist film and shallow grooves are formed in the semiconductor substrate 1 using the etched silicon nitride film as a mask. Subsequently, a dielectric film for burying the shallow grooves, for example, a silicon oxide film is deposited, the silicon oxide film at the regions other than those for the shallow grooves is removed by using a CMP method or the like and, further, the silicon nitride film is removed by a wet etching method or the like. The device isolation region 2 is thus formed.

Then, impurities are ion implantation by using the patterned photoresist film as a mask to form a p-well 3 and an n-well 4. Impurities showing a p-conduction type, for example, boron (B) are ion implanted in the p-well 3, while impurities showing an n-conduction type, for example, phosphorus (P) are ion implanted in the n-well 4. Subsequently, impurities for controlling the threshold value of MISFET may be ion implanted into each of the well regions.

Then, a silicon oxide film as a gate insulation film 5, a polycrystal silicon film as a gate electrode 6 and a silicon oxide film as a cap insulation film 7 are successively deposited to form a stacked film and the stacked film is etched by using a photoresist film patterned by photolithography as a mask. Thus, the gate insulation film 5, the gate electrode 6 and the cap insulation film 7 are formed. The gate insulation film can be formed, for example, by a thermal CVD method. The gate electrode 6 can be formed by a CVD method. For reducing the resistance value of the gate electrode 6, n- or p-impurities may be doped in accordance with the channel type of MISFET. That is, n-impurities may be doped to the gate electrode of the n-channel MISFET, while p-type impurities may be doped to the gate electrode of the p-channel MISFET. In this case, an ion implantation method can be used. Further, a high melting metal silicide film such as $WSi_x$, $MoSi_x$, $TiSi_x$, or $TaSi_x$ may be stacked to the upper portion of the gate electrode 6, or a metal layer such as of tungsten may be formed by way of a barrier metal layer such as of titanium nitride or tungsten nitride (WN) may also be formed. This can reduce the sheet resistance value of the gate electrode 6 to improve the operation speed of MISFET. The cap insulation film 7 can be deposited, for example, by a CVD method.

Then, after depositing a silicon oxide film, for example, by a CVD method on the semiconductor substrate 1, the silicon oxide film 1 anisotropically etched to form a side wall spacer 8 on the side wall of the gate electrode 6. Then, n-type impurities (for example, phosphorus and arsenic (As)) are ion implanted to the p-well 3 using a photoresist film as a mask to form n-semiconductor regions 9 on both sides of the gate electrode 6 on the p-well 3. The n-semiconductor regions 9 are formed in self alignment with the gate electrode 6 and the side wall spacer 8. The n-semiconductor regions 9 function as source and drain regions of the n-channel MISFET. In the same manner, p-impurities (for example, boron fluoride ($BF_2$)) are ion implanted in the n-well 4 using a photoresist film as a mask to form p-semiconductor regions 10 on both sides of the gate electrode 6 on the n-well 4. The p-semiconductor regions 10 are formed in self-alignment with the gate electrode 6 and the side wall spacer 8 and function as source and drain regions of the p-channel MISFET.

In addition, a so-called LDD structure may be formed by forming an impurity semiconductor region act low concentration before forming the side wall spacer 8 and forming an impurity semiconductor region at high concentration after forming the side wall spacer 8.

Figure 11:
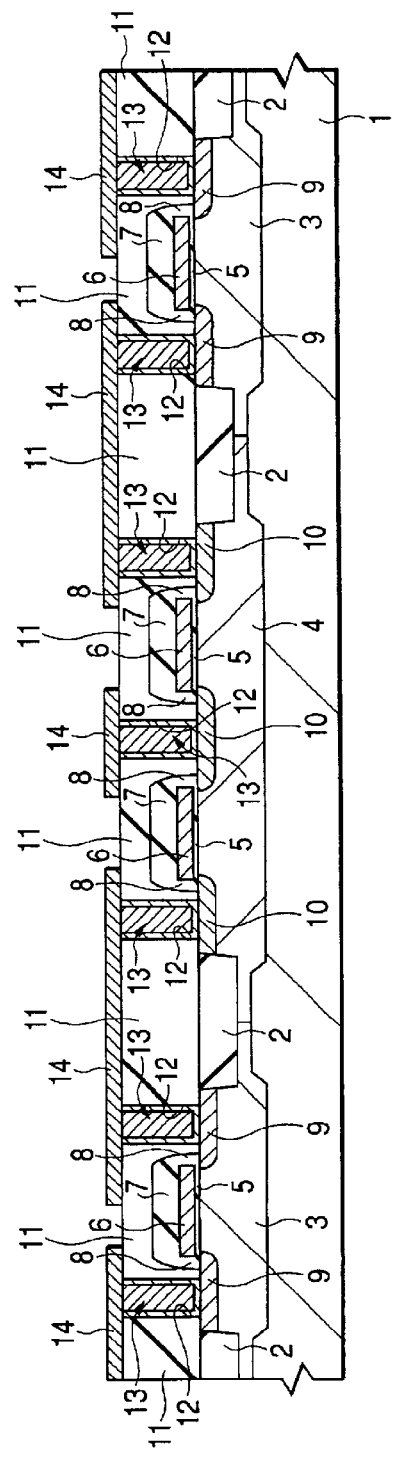
FIG. 11 is a cross sectional view for a main portion of a semiconductor substrate which shows an example of a method of fabricating a semiconductor device in the order of steps as Embodiment 1 of this invention.

Then, as shown in FIG. 11, after depositing a silicon oxide film by a sputtering method or CVD method on the semiconductor substrate 1, the silicon oxide film is polished, for example, by a CMP method to form a first interlayer dielectric film 11 with flattened surface. The first interlayer dielectric film 11 may be formed by a stacked film of a silicon nitride film, an SOG (Spin On Glass) film, a BPSG (Boron Phosphor Silicate Glass) film and a PSG (Phosphor Silicate Glass) film.

Then, via holes 12 are formed to the first interlayer dielectric film 11 by Using photolithography. The via holes 12 are formed at necessary portions such as on the n-semiconductor regions 9 or p-semiconductor regions 10.

Then, plugs 13 are formed in the via holes 12, for example, as described below. At first, a titanium nitride film is formed over the entire surface of the semiconductor substrate 1 including the inside of the via holes 12, for example, by a CVD method and, further, a tungsten film for burying the via holes 12 is formed, for example, by a CVD method. Subsequently, the titanium nitride film and the tungsten film at the regions other than those for the via holes 12 are removed, for example, by a CMP method to form plugs 13. Further, the semiconductor substrate at the bottom of the via holes 12 (n-semiconductor region 9 or p-semiconductor region 10) may be silicided, for example, by depositing a titanium (Ti) film and applying heat treatment before forming the titanium nitride film. The contact resistance at the bottom of the via holes 12 can be reduced by forming such a silicide layer.

Then, a tungsten film, for example, is formed over the entire surface of the semiconductor substrate 1, and the tungsten film is patterned to form wirings 14 for the first wiring layer. The tungsten film can be formed by a CVD method or sputtering method.

Figure 12:
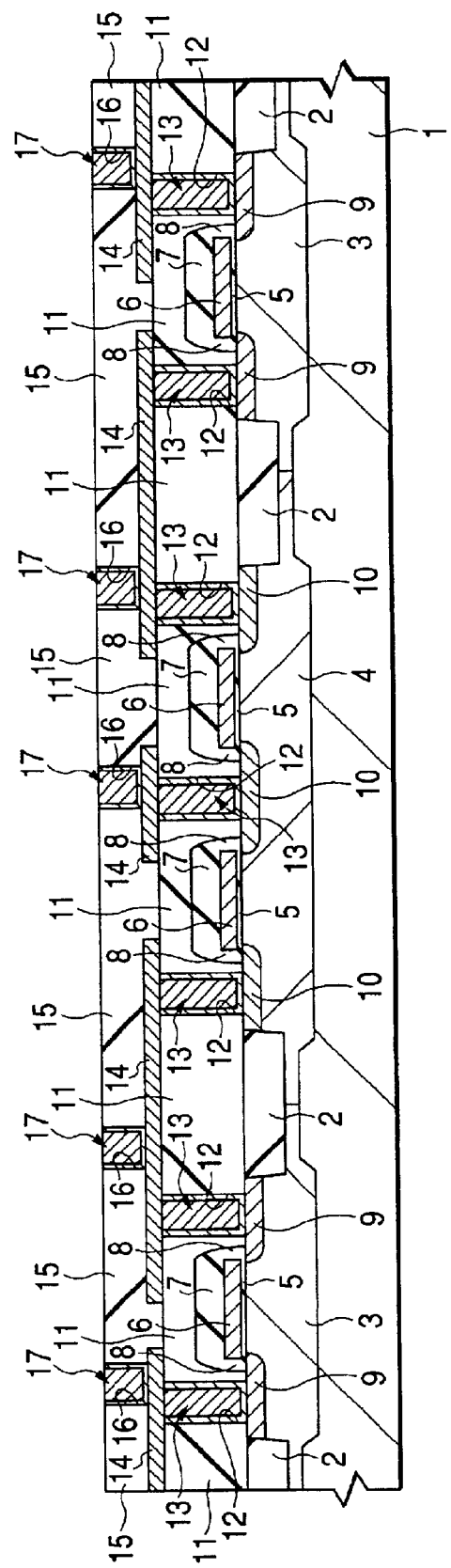
FIG. 12 is a cross sectional view for a main portion of a semiconductor substrate which shows an example of a method of fabricating a semiconductor device in the order of steps as Embodiment 1 of this invention.

Then as shown in FIG. 12, after forming a dielectric film covering the wirings 14, for example, a silicon oxide film, the dielectric film is polished, for example, by a CMP method to form a second interlayer dielectric film 15 with a flattened surface. Then, via holes 16 are formed at predetermined regions in the second interlayer dielectric film 15.

Then, plugs 17 are formed in the via holes 16, for example, as described below. At first, a barrier metal layer is formed over the entire surface of the semiconductor substrate 1 including the inside of the via holes 16 and, further, a copper film burying the via holes 16 is formed. The barrier metal layer comprises, for example, titanium nitride, tantalum or tantalum nitride and is formed, for example, by a CVD method. The copper film functions as a main conductive layer and can be formed, for example, by a plating method. Before forming the copper film by the plating method, a thin copper film can be formed as a seed layer, for example, by a CVD method or sputtering method. Subsequently, the copper film at the regions other than those for the via holes 16 and the barrier metal layer are removed, for example, by a CMP method to form plugs 17.

Figure 13:
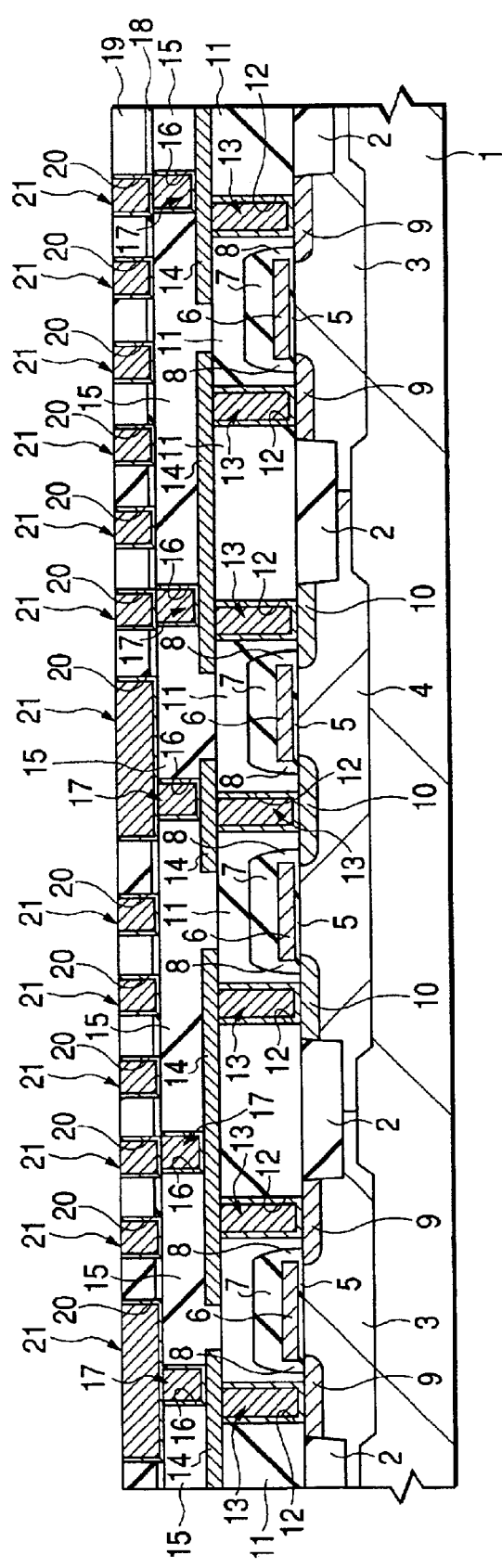
FIG. 13 is a cross sectional view for a main portion of a semiconductor substrate which shows an example of a method of fabricating a semiconductor device in the order of steps as Embodiment 1 of this invention.

Then, as shown in FIG. 13, a stopper dielectric film 18 is formed on the second interlayer dielectric film 15 and the plugs 17 and, further, a dielectric film 19 for forming wirings is formed. The stopper dielectric film 18 is a film as an etching stopper upon fabrication of grooves to the dielectric film 19 and a material having an etching selectivity ratio to the dielectric film 19 is used. The stopper dielectric 18 comprises, for example, a silicon nitride film and the dielectric film 19 comprises, for example, a silicon oxide film. Second layer wirings to be explained next are formed to the stopper dielectric film 18 and the dielectric film 19. Accordingly, the total film thickness is determined depending on the designed film thickness required for the second wiring layer. Further, it is desirable that the thickness of the stopper dielectric film 18 comprising the silicon nitride film of a relatively high specific dielectric constant is as thin as possible providing that the film thickness is enough to attain the stopper function while considering reduction of the wiring capacitance. Then, wiring grooves 20 are formed at predetermined regions of the stopper dielectric film 18 and the dielectric film 19 by using photolithography.

Then, wirings 21 for the second wiring layer are formed inside the wiring grooves 20. The wirings 21 comprise a barrier metal layer and a copper film as the main conductive layer and the barrier metal layer is made, for example, of titanium nitride, tantalum or tantalum nitride. The wirings 21 are formed, for example, as described below. At first, a barrier metal layer is formed over the entire surface of the semiconductor substrate 1 including the inside of the wiring grooves 20 and, further, a copper film burying the wiring grooves 20 is formed. The barrier metal layer is formed, for example, by a CVD method and the copper film is formed, for example, by using a plating method. Before forming the copper film by the plating method, a copper seed layer can be formed, for example, by CVD method or sputtering method. Subsequently, the copper film at the regions other than those for the wiring grooves 20 and the barrier metal layer are removed, for example, by a CMP method to form wirings 21.

Figure 14:
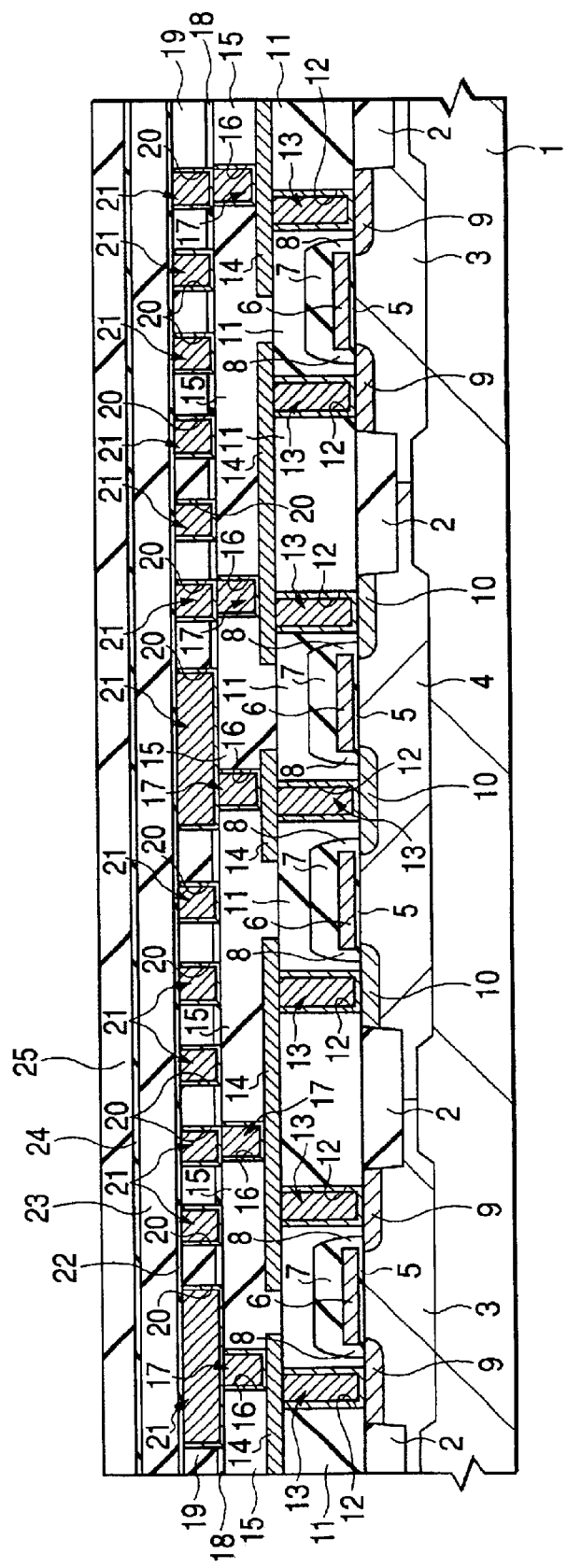
FIG. 14 is a cross sectional view for a main portion of a semiconductor substrate which shows an example of a method of fabricating a semiconductor device in the order of steps as Embodiment 1 of this invention.

Then, a third wiring layer is formed by a dual damascene method. At first, as shown in FIG. 14, a cap insulation film 22, an interlayer dielectric film 23, a stopper dielectric film 24 for forming wirings and a dielectric film 25 for forming wirings are formed successively on the dielectric film 19 and wirings 21 for the second wiring layer.

Via holes 26 are formed as described later in the cap insulation film 22 and the interlayer dielectric film 23. The cap insulation film 22 is constituted of a material having an etching selectivity ratio relative to the interlayer dielectric film 23 and can be formed, for example, of a silicon nitride film. The silicon nitride film is formed, for example, by a plasma CVD method and has a specific dielectric constant of about 7. The thickness of the cap insulation film 22 can be made, for example, to about 50 nm.

The interlayer dielectric film 23 is constituted of a material having Young's modulus smaller by about 20 GPa than the Young's modulus of the material constituting the dielectric film 25 as described above. The interlayer dielectric film 23 comprises, for example, an SiOF film having a Young's modulus of about 50 GPa and the thickness can be made, for example, to about 500 nm. The SiOF film can be formed, for example, by a CVD method.

Wiring grooves 27 are formed as described later in the stopper dielectric film 24 and the dielectric film 25. The stopper dielectric film 24 is constituted of a material having can etching selectivity ratio relative to the dielectric film 25 (dielectric film 25 and interlayer dielectric film 23 in the second method as a method of forming via holes to be described later) and can be formed, for example, of a silicon nitride film. The silicon nitride film is formed, for example, by a plasma CVD method and has a specific dielectric constant of about 7. The thickness of the stopper dielectric film 24 can be made, for example, to about 25 nm.

The dielectric film 25 comprises, for example, a silicon oxide film having a Young's modulus of about 70 GPa and the thickness can be made, for example, to about 200 nm. The silicon oxide film comprises, for example, a TEOS oxide film formed, for example, by a plasma CVD method using a TEOS gas and an ozone gas as the starting gases and has a specific dielectric constant of about 4.3. Wiring grooves to be buried with a third wiring layer to be explained next are formed in the stopper dielectric film 24 and the dielectric film 25. Accordingly, the total film thickness is determined depending on the designed film thickness required for the third wiring layer.

Figure 15:
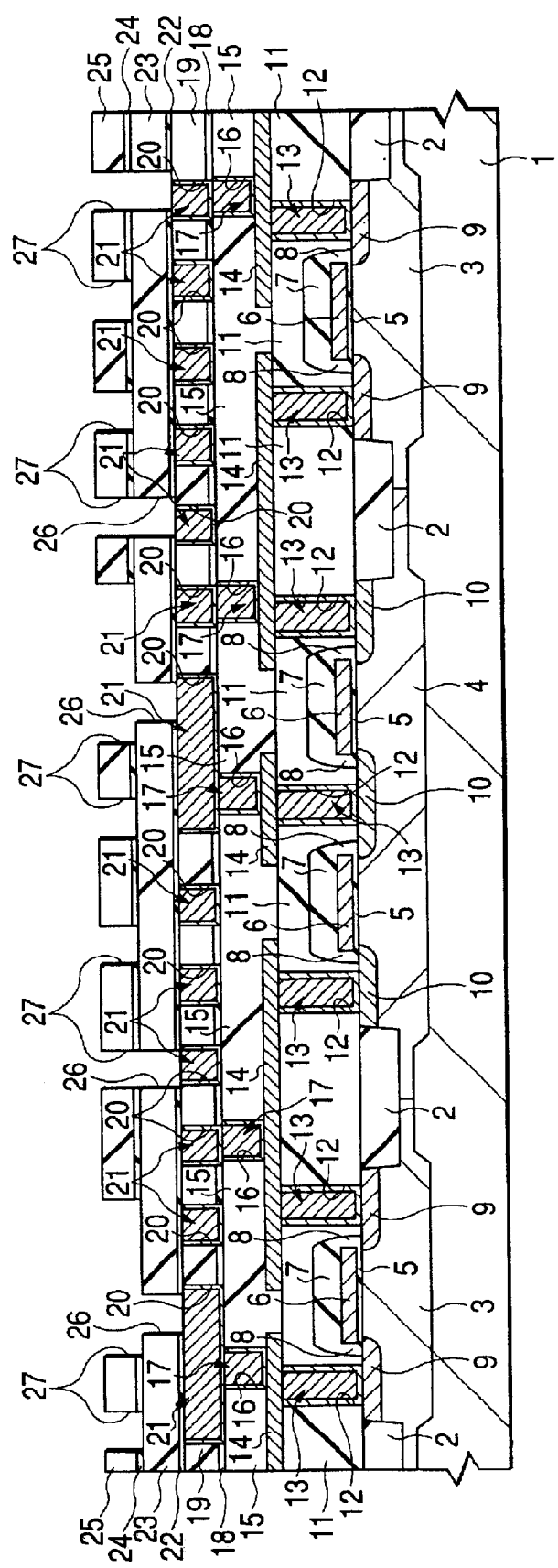
FIG. 15 is a cross sectional view for a main portion of a semiconductor substrate which shows an example of a method of fabricating a semiconductor device in the order of steps as Embodiment 1 of this invention.

Then, as shown in FIG. 15, via holes 26 are formed in the cap insulation film 22 and the interlayer dielectric film 23 while wiring grooves 27 are formed in the stopper dielectric film 24 and the dielectric film 25. The via holes 26 and the wiring grooves 27 by the dual damascene method can be formed, for example, as described below.

At first, deep via holes 26 reaching the wirings 21 are formed in the cap insulation film 22 and the interlayer dielectric film 23 formed on the wirings 21. The via holes 26 are formed by forming a photoresist film patterned to a hole pattern on the dielectric film 25 and successively etching the dielectric film 25, the stopper dielectric film 24, the interlayer dielectric film 23 and the cap insulation film 22 successively, for example, by a dry etching method using the photoresist film as a mask. The hole diameter of the thus formed via hole 26 is, for example, about 0.25 µm.

Then, the via holes 26 are buried with a resist or the like and, subsequently, wiring grooves 27 are formed in the dielectric film 25 and the stopper dielectric film 24. The wiring grooves 27 are formed in the same manner as the formation of the via holes 26 by forming a photoresist film patterned to the groove pattern on the dielectric film 25 and by etching the dielectric film 25 and the stopper dielectric film 24 successively, for example, by a dry etching method using the photoresist film as a mask.

Then, wirings 28 for the third wiring layer are formed inside of the via holes 26 and the wiring grooves 27. The wirings 28 comprises a barrier metal layer and a copper film as the main conductive layer, and a connection member for connecting the wirings 28 and the wirings 21 as the lower layer wirings thereof is formed integrally with the wirings 28. The wirings 28 are formed, for example, by the method as described below.

Figure 16:
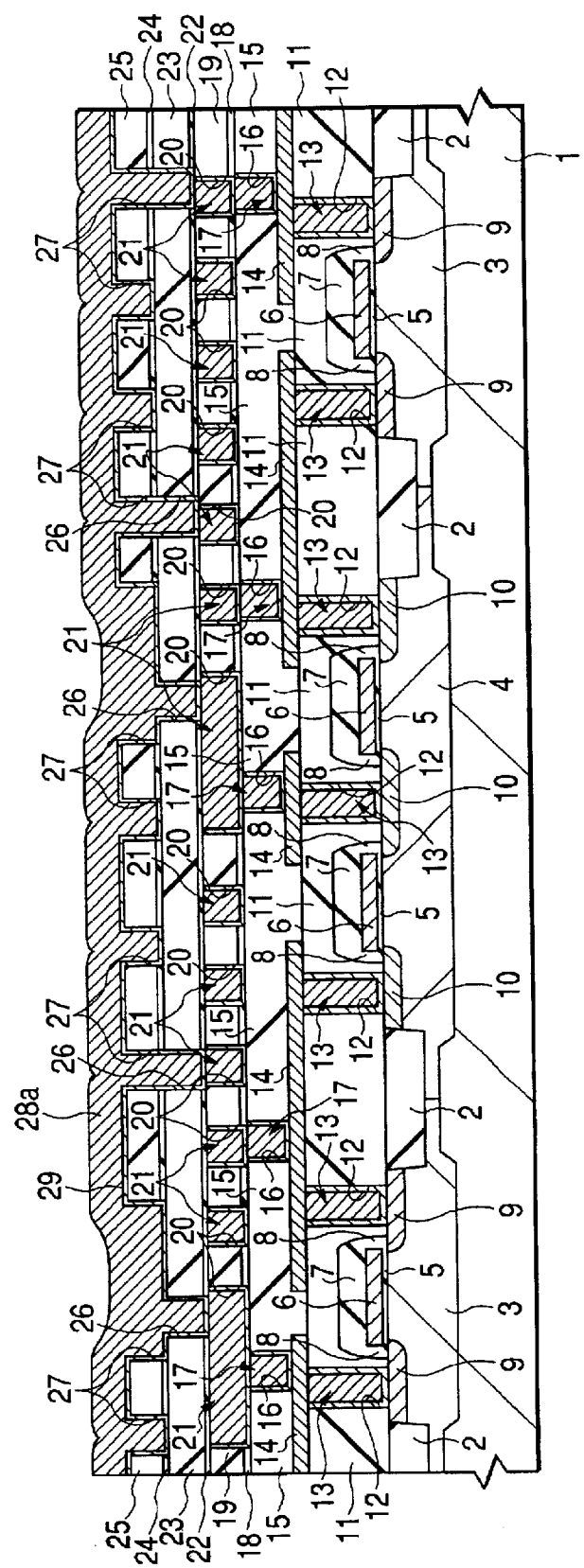
FIG. 16 is a cross sectional view for a main portion of a semiconductor substrate which shows an example of a method of fabricating a semiconductor device in the order of steps as Embodiment 1 of this invention.

At first, as shown in FIG. 16, a barrier metal layer 29 is formed over the entire surface of the semiconductor substrate 1 including the inside of the via holes 26 and the wiring groove 27. The barrier metal layer 29 is made, for example, of titanium nitride, tantalum or tantalum nitride. Then, after forming a copper seed layer (not illustrated) on the barrier metal layer 29, for example, by a CVD method or sputtering method, a copper plating layer 28a is formed. For the plating method, any of electronic plating and electroless plating may be used and the thickness of the plating layer 28a is made to about 600 nm on the substrate plane. Thus, the via holes 26 and the wiring grooves 27 are buried simultaneously. Further, while Embodiment 1 shows formation of the copper film (plating layer 28a) by the plating method, it may be formed also by the sputtering method. In this case, the seed layer described above is not necessary. When the copper film is formed by the sputtering method, a heat treatment is applied so as to bury copper into the via holes 26 and the wiring grooves 27 and copper can be reflown.

Figure 17:
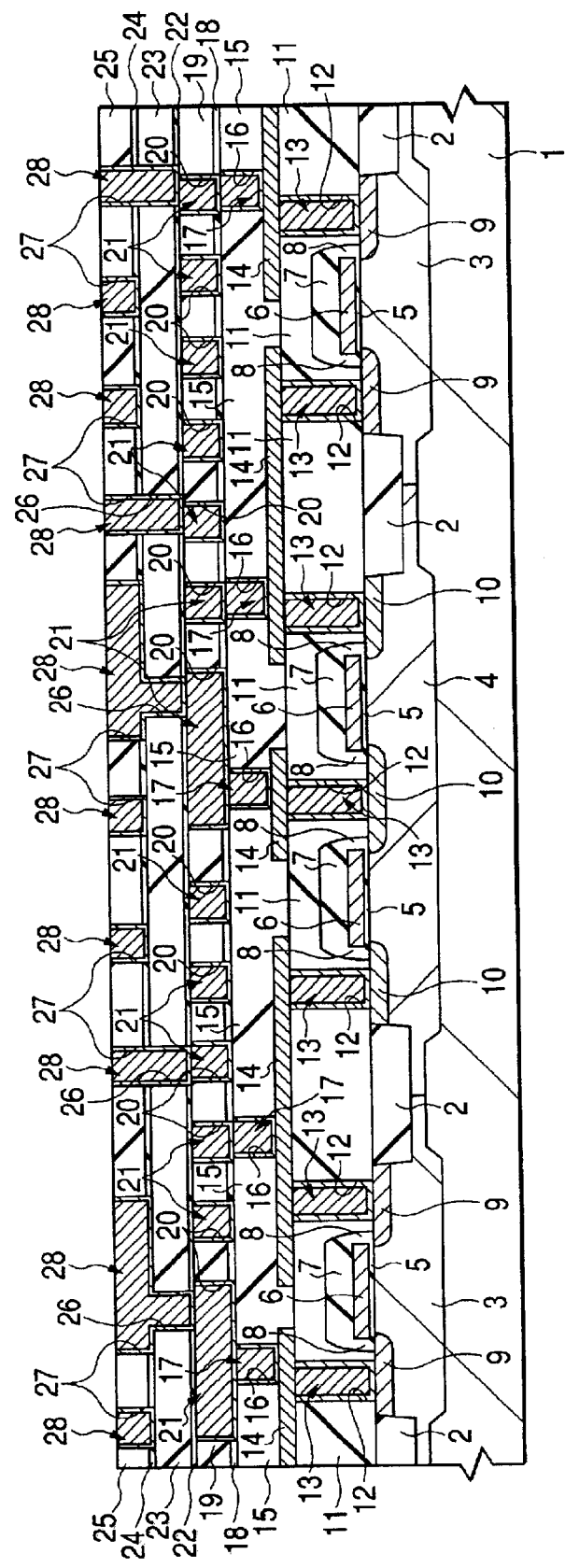
FIG. 17 is a cross sectional view for a main portion of a semiconductor substrate which shows an example of a method of fabricating a semiconductor device in the order of steps as Embodiment 1 of this invention.

Then, as shown in FIG. 17, the plating layer 28a and the seed layer are polished by using a CMP method. Since copper is polished at a higher speed, the copper portion is removed previously. Polishing is further continued to remove also the barrier metal layer 29 on the dielectric film 25. Thus, the copper film (plating layer 28a and the seed layer) at the regions other than those for the wiring grooves 27 and the barrier metal layer 29 are removed to form wirings 28 formed integrally with the connection member.

Figure 18:
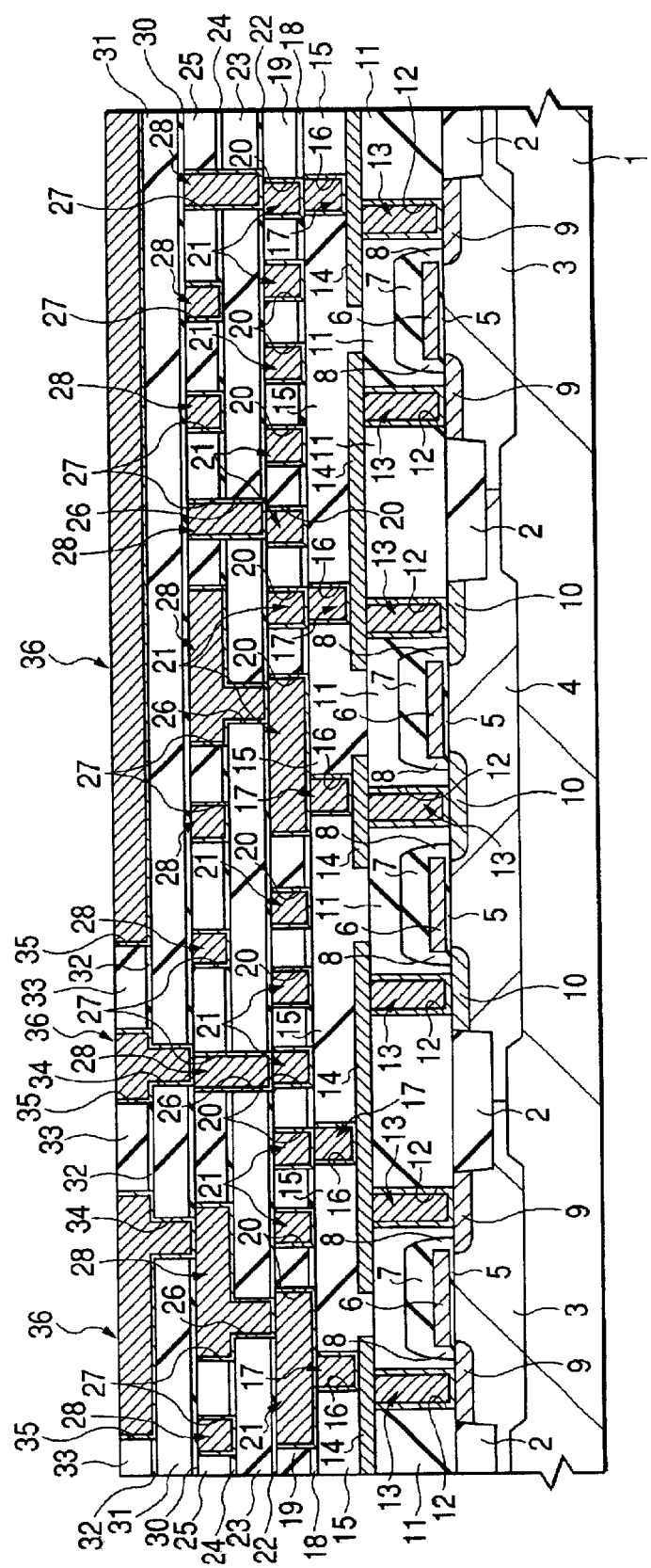
FIG. 18 is a cross sectional view for a main portion of a semiconductor substrate which shows an example of a method of fabricating a semiconductor device in the order of steps as Embodiment 1 of this invention.

Then, as shown in FIG. 18, a cap insulation film 30, an interlayer dielectric film 31, a stopper dielectric film 32 for forming wirings and a dielectric film 33 for forming wirings are successively formed above the dielectric film 25 and the wirings 28. Each of the dielectric film 30 to 33 is identical with each of the stopper dielectric film 22, the interlayer dielectric film 23, the stopper dielectric film 24 for forming wirings and the dielectric film 23 for forming the wirings, in which the interlayer dielectric film 31 is constituted, for example, with an SiOF film of about 500 nm thickness, and the dielectric film 33 is constituted, for example, with a silicon oxide film of about 200 nm thickness. Further, via holes 34 are formed in the cap insulation film 30 and the interlayer dielectric film 31, while wiring grooves 35 are formed in the stopper dielectric film 32 and the dielectric film 33 in the same manner as in the case of the third wiring layer described above. The hole diameter of the via hole 34 is, for example, about 0.25 µm. Further, wirings 36 for the fourth wiring layer formed integrally with the connection member are formed in the same manner as the wirings 28 for the third wiring layer.

Figure 19:
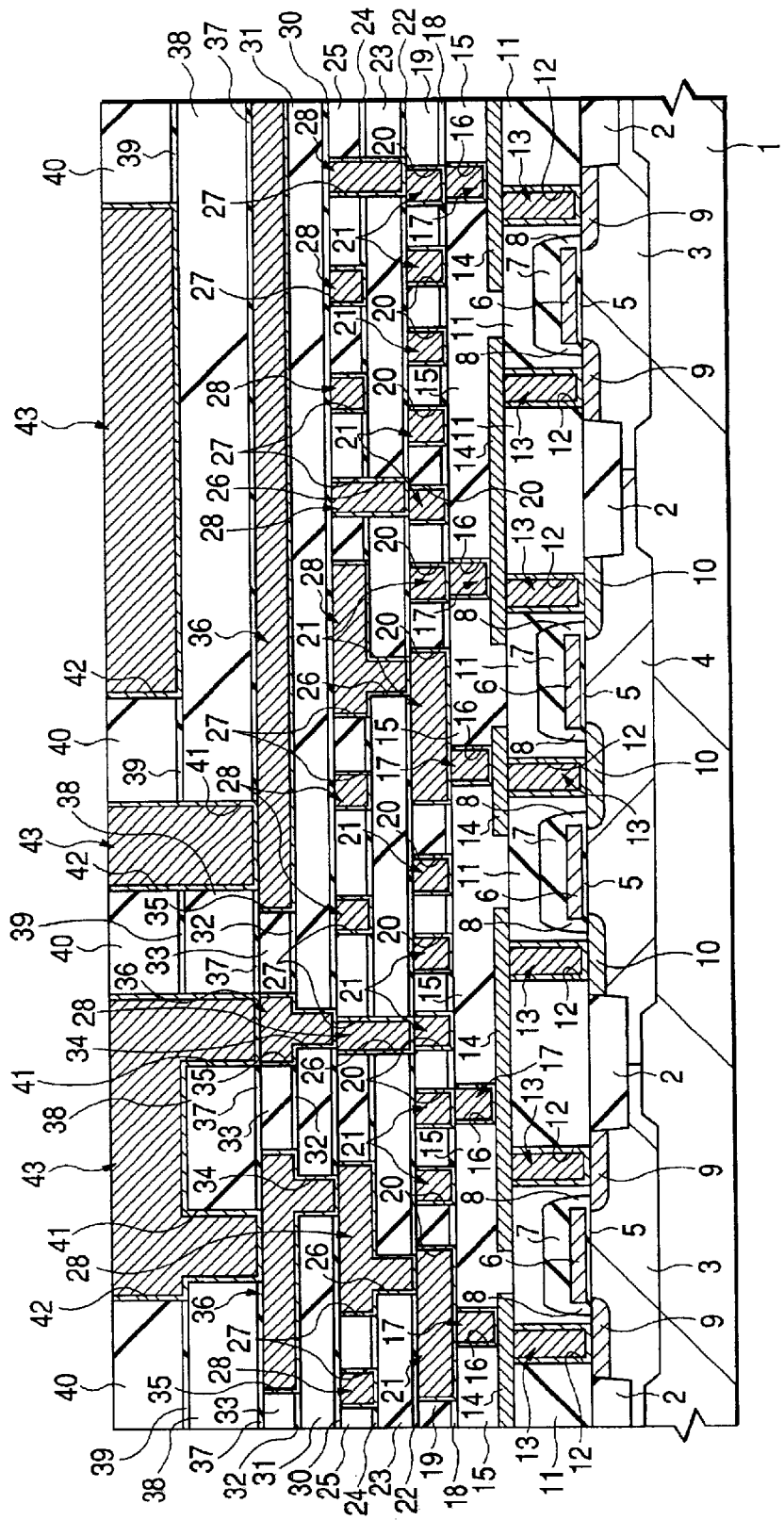
FIG. 19 is a cross sectional view for a main portion of a semiconductor substrate which shows an example of a method of fabricating a semiconductor device in the order of steps as Embodiment 1 of this invention.

Then, a shown in FIG. 19, a cap insulation film 37, an interlayer dielectric film 38, a stopper dielectric film 39 for forming wirings and a dielectric film 40 for forming wirings are successively formed above the dielectric film 33 and the wirings 36. Each of the dielectric films 37 to 40 is identical with each of the stopper dielectric film 22, the interlayer dielectric film 23, the stopper dielectric film 24 for forming wirings and the dielectric film 25 for forming the wirings, in which the interlayer dielectric film 38 is constituted, for example, with an SiOF film of about 500 nm thickness, and the dielectric film 33 is constituted, for example, with a silicon oxide film of about 200 nm thickness. Further, via holes 41 are formed in the cap insulation film 37 and the interlayer dielectric film 38, while wiring grooves 42 are formed in the stopper dielectric film 39 and the dielectric film 40 in the same manner as in the case of the third wiring layer described above. The hole diameter of the via hole 41 is, for example, about 0.5 μm. Further, wirings 43 for the fifth wiring layer formed integrally with the connection member are formed in the same manner as the wirings 28 for the third wiring layer.

Figure 20:
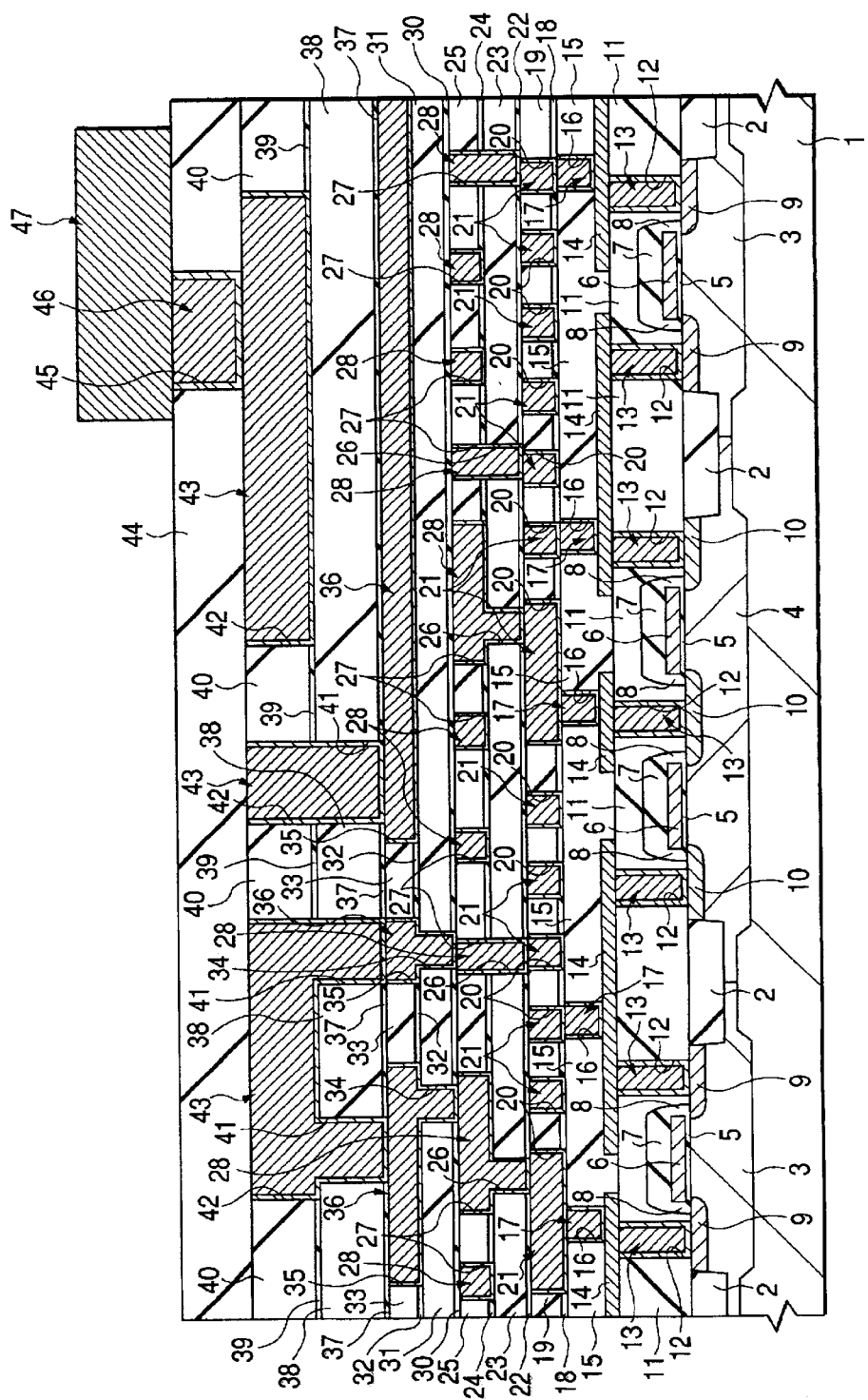
FIG. 20 is a cross sectional view for a main portion of a semiconductor substrate which shows an example of a method of fabricating a semiconductor device in the order of steps as Embodiment 1 of this invention.

Then, as shown in FIG. 20, after forming a dielectric film 44 on the dielectric film 40 and the wirings 43, via holes 45 reaching the wirings 43 are formed in the dielectric film 44. The hole diameter of the via hole 45 is, for example, about 0.75 μm. Then, a titanium nitride film is formed over the entire surface of the semiconductor substrate 1 including the inside of the via holes 45, for example, by a CVD method and, successively, a tungsten film for burying the via holes 45 is formed, for example, by a CVD method. Then, the titanium nitride film and the tungsten film at the regions other than those for the via holes 45 are removed, for example, by a CMP method to form plugs 46.

Then, an aluminum film, for example, is formed over the entire surface of the semiconductor substrate 1, and the aluminum film is patterned by photolithography to form wirings 47 for a sixth wiring layer as the uppermost layer wirings. Then, when the entire surface of the semiconductor substrate 1 is covered with a passivation film 48, the semiconductor device shown in FIG. 1 is completed substantially.

While this embodiment 1 is applied to a semiconductor device having multi-layered wirings comprising the sixth wiring layer, it can be applied to any of optional wiring layers formed by the dual damascene system irrespective of the number of wiring layers.

As described above, according to Embodiment 1, the inter-wiring layer film surrounding the wiring grooves is constituted of a dielectric material having a Young's modulus of 60 GPa or more, for example, a silicon oxide film formed by the CVD method, and an inter-via layer film surrounding the via holes is constituted of a dielectric material having a Young's modulus of less than 60 GPa, for example, an SiOF film formed by a CVD method. Thus, even when the volume of the copper expands in the via holes upon temperature elevation from room temperature to about 500° C., since the inter-via layer film elastically deforms correspondingly and the inter-wiring layer film functions to suppress the volumic expansion of copper, absorption of copper inside the via holes to copper inside the wiring grooves can be suppressed.

Further, since the SiOF film constituting the inter-via layer film has a specific dielectric constant of about 3.6 which is smaller compared with the specific dielectric constant of the silicon oxide film, the wiring capacitance can be reduced compared with a case of using the silicon oxide film for the inter-via layer film.

Further, since the inter-wiring layer film and the inter-via layer film are constituted of an inorganic dielectric material deposited by the CVD method, a processing technique similar with the existent dry etching method can be applied in the fabrication step for the via holes and wiring grooves.

Embodiment 2

TABLE 2

| Generation | Second Generation | | |
|---|---|---|---|
| Inter wiring layer film (Young's modulus: Y2) | SiOF (50 GPa) | | |
| Inter-via layer film (Young's modulus: Y1) | SiLK (10 GPa) | | |
| Stopper dielectric film | SiN | SiC | None |
| Via hole diameter: R | 0.18 μm | | |
| Index    R/Y1 | 18.0 | | |
| Y2 − Y1 | 40 | | |
| Wiring capacitance | 3.9 | 3.7 | 3.5 |

Table 2 collectively shows materials for each of the dielectric films and the evaluation index of the dual damascene structure in Embodiment 2 in the same manner as in Table 1. Further, FIG. 21 shows an example of a cross sectional view for a main portion of dual damascene wirings applied with Embodiment 2. This Embodiment 2 shows each of dielectric materials applied to dual damascene wirings with the hole diameter of the via hole connecting the upper and lower wiring layers of about 0.2 μm or less as the second generation. The inter-wiring layer film is made of a dielectric material having a Young's modulus of 30 GPa or more and the inter-via layer film is made of a dielectric material having a Young's modulus of less than 30 GPa, both of which are constituted of the dielectric material formed by a CVD method or a coating method.

Table 2 and FIG. 21 show an example of dual damascene wirings comprising an SiOF film having a Young's modulus of about 50 GPa and a specific dielectric constant of about 3.6 for an inter-wiring layer film and a PAE (Polyarylene ether) type material, for example, an SiLK film having a Young's modulus of about 10 GPa and a specific dielectric constant of about 2.7 to 2.8 for an inter-via layer film. The SiOF film is formed, for example, by a CVD method and the SiLk film is formed, for example, by a coating method. A silicon nitride film having a stopper function relative to the SiOF film and the SiLk film is used for the stopper dielectric film and the cap insulation film.

For preparing the evaluation index, while dual damascene wirings having via holes with the hole diameter of 0.18 μm were used, it can of course be applied also to dual damascene wirings having via holes with the hole diameter of other than 0.18 μm.

Further, a silicon oxide film can be used instead of the SiOF film for the inter-wiring layer film. Further, instead of the SiLK film, other low dielectric constant film formed by a coating method such as a PAE type material (for example, FLARE film), a BCB (Benzocyclobutene) type material, an HSQ (Hydrogen Silsequioxane) type material and MSQ (Methyl Silsesquioxane) type material, or low dielectric film formed by a CVD method such as an SiOC type material or CF type material can be used for the inter-via layer film.

As shown in Table 2, when the inter-wiring layer film is constituted of the SiOF film, and the inter-via layer film is constituted of the SiLK film, the index: R/Y1 is 18.0 and the index: Y2−Y1 is 40. It is thus considered that degradation of the dual damascene wirings can be suppressed in the dual damascene structure in which the hole diameter of the via hole is 0.18 μm. Further, the wiring capacitance can be decreased from 4.5 of the first generation shown in Embodiment 1 to 3.9 by using the SiOF film having a specific dielectric constant of about 3.6 for the inter-wiring film and the SiLk film having a specific dielectric constant of about 2.7 to 2.8 for the inter-via layer film.

FIG. 22 shows a first modified example of dual damascene wirings in Embodiment 2. A stopper dielectric film is constituted of a material having an etching selectivity ratio to the inter-wiring layer film (SiOF) film, an inter-via layer film (SiLK) film or both of them, and a silicon nitride film has been exemplified for the dual damascene wirings shown in FIG. 21. However, since the specific dielectric constant of the silicon nitride film is relatively high as about 7, it is disirable to be a low dielectric constant film having a stopper function while considering reduction of the wiring capacitance. FIG. 22 shows a dual damascene structure using an SiC film having an specific dielectric constant of about 4 for the stopper dielectric film. By constituting the stopper dielectric film with the SiC film, the wiring capacitance can be reduced from 3.9 to 3.7 compared with a case of constituting the stopper dielectric film with the silicon nitride film.

Further, FIG. 23 shows a second modified example of dual damascene wirings in Embodiment 2. Dual damascene wirings in which the wiring capacitance is reduced without using the stopper dielectric film is shown. Since the stopper dielectric film is not used, the wiring capacitance can be reduced from 3.9 to 3.5 compared with a case of using the stopper dielectric film comprising the silicon nitride film.

As described above according to Embodiment 2, the inter-wiring layer film that surrounds the wiring grooves is constituted of the dielectric material having a Young's modulus of 30 GPa or more, for example, an SiOF film formed by the CVD method and the inter-via layer film that surrounds via holes is constituted of the dielectric material having a Young's modulus of less than 30 GPa, for example, the SiLK film formed by the CVD method or the coating method. With the constitution, elastic deformation of the inter-via layer film tends to occur correspondingly to the volumic expansion of copper also in the via hole having a hole diameter of about 0.18 $\mu$m and absorption of copper inside the via hole to copper inside the wiring groove can be suppressed.

Since the specific dielectric constant of the SiOF film constituting the inter-wiring layer film is about 3.6 and the specific dielectric constant of the SiLK film constituting the inter-via layer film is about 2.7 to 2.8, the wiring capacitance can further be reduced compared with that of Embodiment 1.

Embodiment 3

TABLE 3

| Generation | Third Generation | |
| --- | --- | --- |
| Inter-wiring layer film (Young's modulus: Y2) | SiLK (10 GPa) | |
| Inter-via layer film (Young's modulus: Y1) | Nanoglass (2 GPa) | |
| Stopper dielectric film | SiC | None |
| Via hole diameter: R | 0.12 $\mu$m | |
| Index    R/Y1 | 60.0 | |
| Y2 − Y1 | 8 | |
| Wiring capacitance | 3.4 | 3.2 |

Figure 24:
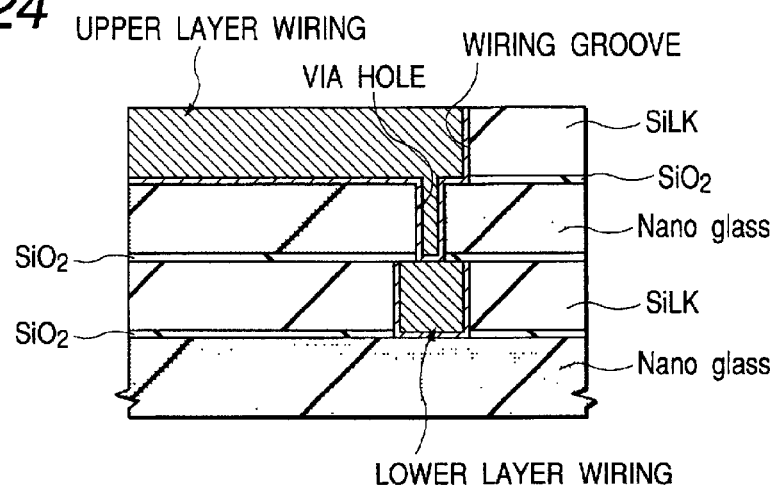
FIG. 24 is a cross sectional view for a main portion of a semiconductor substrate which shows an example of a method of manufacturing dual damascene wirings in the order of steps as Embodiment 3 of this invention.

Table 3 collectively shows materials for each of the dielectric films and the evaluation index of the dual damascene structure in Embodiment 3 in the same manner as in Table 1. Further, FIG. 24 shows an example of a cross sectional view for a main portion of dual damascene wirings applied with Embodiment 3. This Embodiment 3 shows each of dielectric materials applied to dual damascene wirings with the hole diameter of the via hole connecting the upper and lower wiring layers of about 0.13 $\mu$m or less as the second generation. The inter-wiring layer film comprises a dielectric material having a Young's modulus of 6 GPa or more and formed by a CVD method of coating method, and the inter-via layer film comprises a dielectric material having a Young's modulus of less than 6 GPa and a coating method.

Table 3 and FIG. 24 show an example of dual damascene wirings comprising a PAE type material, for example, an SiLK film having a Young's modulus of about 10 GPa and a specific dielectric constant of about 2.7 to 2.8 for an inter-via layer film and a porous HSG type material, for example, a Nanoglass film having a Young's modulus of about 2 GPa and a specific dielectric constant of about 2.2 for an inter-wiring layer film. The SiLK film and the Nanoglass film are formed, for example, by a coating method. A silicon oxide film having a stopper function relative to the SiLK film and the Nanoglass film is used for the stopper dielectric film and the cap insulation film.

For preparing the evaluation index, while dual damascene wirings having via holes with the hole diameter of 0.12 $\mu$m were used, it can of course be applied also to dual damascene wirings having via holes with the hole diameter of other than 0.12 $\mu$m. Further, while the inter-wiring layer film was constituted only with the SiLK film, it may be constituted of a stacked film of a silicon oxide film and an SiLK film.

Further, for the inter-wiring layer film, a dielectric constant film formed by a coating method such as other PAE type material (for example, FLARE film), BCB type material, HSQ or MSQ type material, or a dielectric constant film formed by a CVD method such as an SiOC type material or CF type material can be used in place of the SiLK film.

As shown in Table 3, when the inter-wiring layer film is constituted of the SiLK film, and the inter-via layer film is constituted of the Nanoglass film, the index: R/Y1 is 60.0 and the index: Y2–Y1 is 8. It is thus considered that degradation of the dual damascene wirings can be suppressed in the dual damascene structure in which the hole diameter of the via hole is 0.12 $\mu$m. Further, the wiring capacitance can be decreased from 3.9 of the second generation shown in Emoodiment 2 to 3.4 by using the SiLK film having a specific dielectric constant of about 2.7 to 2.8 for the inter-wiring film, the Nanoglass film having a specific dielectric constant of about 2.2 for the inter-via layer film and the silicon oxide film having a specific dielectric constant of about 4.3 to the stopper dielectric film and the cap insulation film.

Figure 25:
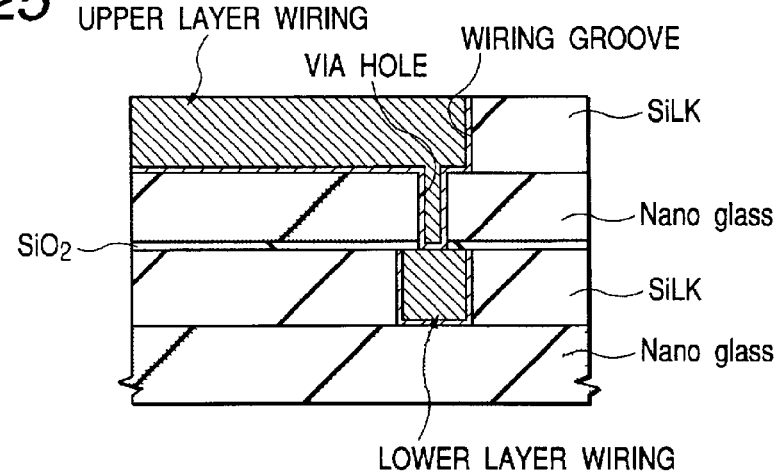
FIG. 25 is a cross sectional view for main portion of a semiconductor substrate showing a modified example of dual damascene wirings as Embodiment 3 of this invention.

Further, FIG. 25 shows a modified example of dual damascene wirings in Embodiment 3. The stopper dielectric film is constituted of a material having an etching selectivity ratio to the inter-wiring layer film (SiLK film) or the inter-via layer film (Nanoglass film) or to both of them and the silicon oxide film has been exemplified in the wirings shown in FIG. 24. This embodiment shows dual damascene wirings in which the wiring capacitance is reduced without using the stopper dielectric film. Since the stopper dielectric film is not used, the wiring capacitance can be reduced from 3.4 to 3.2 compared with a case of using the stopper dielectric film comprising the silicon oxide film.

TABLE 4

| | Material | Young's modulus (GPa) | Specific dielectric constant |
|---|---|---|---|
| Interlayer film | SiO$_2$ | 70 | 4.3 |
| | SiOF | 50 | 3.6 |
| | PAE type material (SiLK, FLARE) | ~10 | 2.7~2.8 |
| | BCB type material | | |
| | HSG type material | | |
| | Porous HSQ type material (Nanoglass) | 2 | 2.2 |
| Stopper dielectric film | SiN | — | 7 |
| | SiC | — | 5 |

Table 4 collectively shows the Young's modulus and the specific dielectric constant of various dielectric films used for the inter-wiring layer film or the inter-via layer film.

As described above according to Embodiment 3, the inter-wiring layer film that surrounds the wiring grooves is constituted of a dielectric material having a Young's modulus of 60 GPa or more, for example, an SiLK film formed by a CVD method or coating method and the inter-via layer film that surrounds via holes is constituted of the dielectric material having a Young's modulus of less than 6 GPa, for example, a Nanoglass film formed by a coating method. With the constitution, the inter-via layer film tends to elastically deform corresponding to the volumic expansion of copper also in the via holes having a hole diameter of about 0.12 μm and absorption of copper inside the via holes to copper inside the wiring grooves can be suppressed.

Since the specific dielectric constant of the SiLK film constituting the inter-wiring layer film is about 2.7 to 2.8 and the specific dielectric constant of the Nanoglass film constituting the inter-via layer film is about 2, the wiring capacitance can further be reduced compared with that of Embodiment 2.

Embodiment 4

Figure 26:
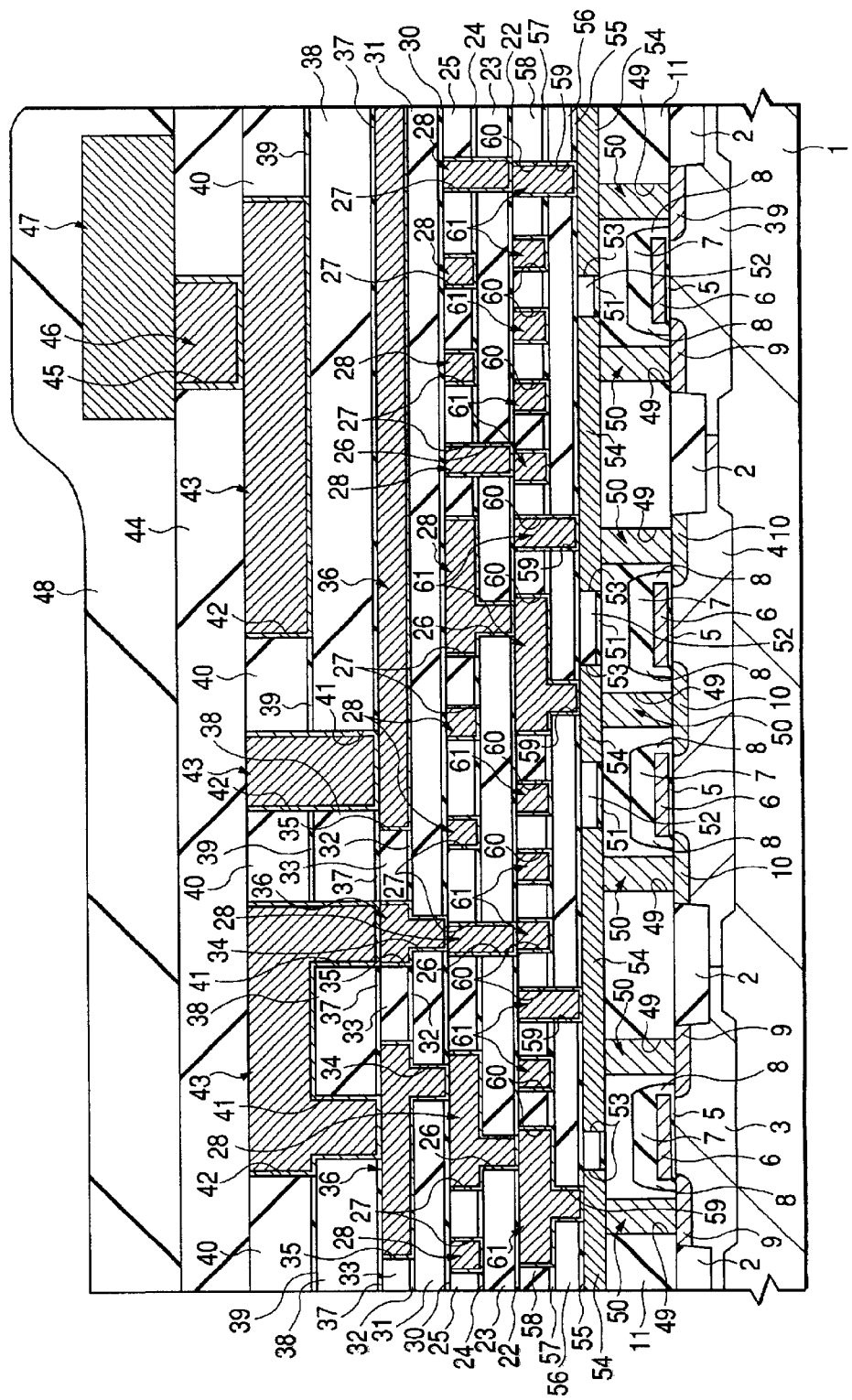
FIG. 26 is a cross sectional view for a main portion of a semiconductor substrate showing a semiconductor device as Embodiment 4 of this invention.

FIG. 26 is a cross sectional view for a main portion of a semiconductor substrate showing a semiconductor device as Embodiment 4. This is an example of a multi-layered wiring structure of constituting a first wiring layer with single damascene wirings and second to fifth wiring layers with dual damascene wirings. The third to sixth wiring layers are identical with those of Embodiment 1.

Plugs 50 comprising, for example, a tungsten film are buried inside of via holes 49 formed at necessary portions of a first interlayer dielectric film 11 on an n-semiconductor region 9 of an n-channel MISFET and a p-semiconductor region 10 of a p-channel MISFET. A stopper dielectric film 51 and a dielectric film 52 for forming wirings are formed above the plugs 50. The stopper dielectric film 51 is a film that functions as etching stopper upon fabrication of grooves in the dielectric film 52 and a material having an etching selectivity ratio to the dielectric film 52 is used. The stopper dielectric film 51 is, for example, a silicon nitride film. Wiring grooves 53 reaching the plugs 50 are formed in the stopper dielectric film 51 and the dielectric film 52. Wirings 54 for the first wiring layer comprising, for example, a tungsten film are buried in the wiring grooves 53.

A cap insulation film 55, an interlayer dielectric film 56, a stopper dielectric film 57 for forming wirings and a dielectric film 58 for forming wirings are formed successively formed above the wirings 54 of the first wiring layer. Each of the dielectric films 55 to 58 is identical with each of the stopper dielectric film 22, the interlayer dielectric film 22, the interlayer dielectric film 23, the stopper dielectric film 24 for forming the wirings and the dielectric film 25 for forming the wirings in Embodiment 1. The interlayer dielectric film 56 is constituted, for example, with an SiOF film with a thickness of about 500 nm and the dielectric film 58 is constituted, for example, with a silicon oxide film with a thickness of about 200 nm. Further, via holes 59 are formed in the cap insulation film 55 and the interlayer dielectric film 56, and wiring grooves 60 are formed in the stopper dielectric film 57 and the dielectric film 58. The hole diameter of the via hole 59 is, for example, about 0.25 μm. Further, wirings 61 for a second wiring layer formed integrally with the connection member are formed.

As described above, according to Embodiment 4, since the second to fifth wiring layers are constituted of dual damascene wirings according to this invention, the wiring capacitance can be reduced from that in Embodiment 1.

The invention made by the present inventors has been explained specifically based on preferred embodiments of the invention but it will be apparent that the invention is not restricted to such preferred embodiments but can be modified variously within a range not departing the gist thereof.

For example, in the previous embodiments, it is exemplified that the silicon oxide film is used for the inter-wiring layer film and the SiOF film is used for the inter-via layer film in the dual damascene structure with the hole diameter of the via hole of about 0.25 to 0.5 μm, the SiOF film is used for the inter-wiring layer film and the SiLK film is used for the inter-via layer film in the dual damascene structure with the hole diameter of the via hole of about 0.18, and the SiLK film is used for the inter-wiring layer film and the Nanoglass film is used for the inter-via layer film in the dual damascene structure with the hole diameter of the via hole of about 0.12 μm, but combination of the materials for the inter-wiring layer and the material for the inter-via layer is not restricted only to them and the material for the winter-wiring layer and the material for the inter-vial layer can be selected variously while considering the process such as heat treatment or etching or the wiring capacitance in each of the generations.

Among the inventions disclosed in this application, the advantageous effects obtained by representative ones are simply described below.

According to this invention, even when expansion and shrinkage are caused by thermal stress to the connection member inside the via holes of dual damascene wirings, since the inter-via hole film tends to elastically deform correspondingly, formation of voice in the inside of the via holes can be prevented. This can suppress increase of the resistance inside the via holes to improve the heat resistance and the electron migration resistance of the dual damascene wirings. Further, since the low dielectric constant material is used for the inter-via layer film or the inter-wiring layer film, the wiring capacitance can be reduced. This can avoid wiring delay.

Accordingly, this invention can provide a wiring structure suitable to size-reduced wirings or a fabrication method of a wiring structure.

What is claimed is:

1. A method of fabricating a semiconductor integrated circuit device, comprising:
    (a) forming a lower layer dielectric film including a first silicon oxide film containing fluorine over a major surface of a wafer;
    (b) forming an upper layer dielectric film including a second silicon oxide film substantially without fluorine as compared with the first silicon oxide film over the first silicon oxide film, the upper and lower layer dielectric film constituting an inter-layer dielectric film having an inter-wiring layer portion embedded in the upper layer dielectric film and an inter-via layer portion embedded in the lower layer dielectric film respectively;

(c) forming via holes through said upper dielectric film and said lower dielectric film and then forming wiring grooves in the upper dielectric film, wherein at least one of said wiring grooves includes one of said via holes in a grove pattern, said at least one of the wiring grooves and said one of said via holes are connected therethrough, and said at least one of the wiring grooves has an area larger than an area of said one of said via holes in plan view;

(d) forming a barrier metal along said wiring grooves and via holes and then filling said at least one of the wiring grooves and said one of said via holes with copper so as to integrally form an embedded wiring and a copper plug electrically connecting the embedded wiring to a lower wiring or electrode, wherein a Young's modular of the lower dielectric film is smaller than that of the upper dielectric film.

2. A method of fabricating a semiconductor integrated circuit device according to claim 1, wherein a stopper dielectric film is formed between the inter-wiring layer portion and the inter-via layer portion.

3. A method of fabricating a semiconductor integrated circuit device according to claim 2, wherein the stopper film is a SIC film.

4. A method of fabricating a semiconductor integrated circuit device according to claim 2, wherein the stopper film is a SiN film.

5. A method of fabricating a semiconductor integrated circuit device according to claim 1, wherein a stopper dielectric film is not formed between the inter-wiring layer portion and the inter-via layer portion.

* * * * *